(12) United States Patent
Li et al.

(10) Patent No.: US 9,730,333 B2
(45) Date of Patent: Aug. 8, 2017

(54) PHOTO-CURING PROCESS FOR METALLIC INKS

(75) Inventors: Yunjun Li, Austin, TX (US); David Max Roundhill, Austin, TX (US); Mohshi Yang, Austin, TX (US); Igor Pavlovsky, Cedar Park, TX (US); Richard Lee Fink, Austin, TX (US); Zvi Yaniv, Austin, TX (US)

(73) Assignees: Applied Nanotech Holdings, Inc., Austin, TX (US); Ishihara Chemical Co., Ltd., Austin, TX (US)

( * ) Notice: Subject to any disclaimer, the term of this patent is extended or adjusted under 35 U.S.C. 154(b) by 1029 days.

(21) Appl. No.: 12/466,323

(22) Filed: May 14, 2009

(65) Prior Publication Data

US 2009/0311440 A1    Dec. 17, 2009

Related U.S. Application Data

(60) Provisional application No. 61/053,574, filed on May 15, 2008, provisional application No. 61/169,618, filed on Apr. 15, 2009.

(51) Int. Cl.
*B05D 3/06* (2006.01)
*H05K 3/12* (2006.01)

(52) U.S. Cl.
CPC ... *H05K 3/1283* (2013.01); *H05K 2201/0257* (2013.01); *H05K 2203/107* (2013.01); *H05K 2203/1131* (2013.01)

(58) Field of Classification Search
USPC ........ 427/532, 541, 542, 553, 555, 558, 559
See application file for complete search history.

(56) References Cited

U.S. PATENT DOCUMENTS 3,239,597 A    3/1966 Flynn
3,580,731 A    5/1971 Milewski et al.
(Continued)

FOREIGN PATENT DOCUMENTS

CN    1509206 A    6/2004
CN    1803940      7/2006
(Continued)

OTHER PUBLICATIONS

Kogelschatz, Excimer Lamps: History, Discharge Physics, and industrial Applications, Proc. SPIE, vol. 5483, year 2004, p. 272-286.*

(Continued)

*Primary Examiner* — Dah-Wei D Yuan
*Assistant Examiner* — Nga Leung V Law
(74) *Attorney, Agent, or Firm* — Kelly Kordzik; Matheson Keys Daffer & Kordzik PLLC

(57) ABSTRACT

A solution of metal ink is mixed and then printed or dispensed onto the substrate using the dispenser. The film then is dried to eliminate water or solvents. In some cases, a thermal curing step can be introduced subsequent to dispensing the film and prior to the photo-curing step. The substrate and deposited film can be cured using an oven or by placing the substrate on the surface of a heater, such as a hot plate. Following the drying and/or thermal curing step, a laser beam or focused light from the light source is directed onto the surface of the film in a process known as direct writing. The light serves to photo-cure the film such that it has low resistivity.

22 Claims, 17 Drawing Sheets

(56) References Cited

U.S. PATENT DOCUMENTS

| | | | |
|---|---|---|---|
| 3,796,598 A | 3/1974 | Gejyo et al. |
| 3,950,605 A | 4/1976 | Hori et al. |
| 4,093,466 A | 6/1978 | Davis |
| 4,151,008 A | 4/1979 | Kirkpatrick |
| 4,194,913 A | 3/1980 | Davis |
| RE30,434 E | 11/1980 | Davis |
| 4,234,631 A | 11/1980 | Davis |
| 4,331,518 A | 5/1982 | Wilson |
| 4,591,951 A | 5/1986 | Iwamoto et al. |
| 4,640,746 A | 2/1987 | Nobel et al. |
| 4,681,670 A | 7/1987 | Nobel et al. |
| 4,749,626 A | 6/1988 | Kadija et al. |
| 4,756,791 A | 7/1988 | D'Angelo et al. |
| 4,922,322 A | 5/1990 | Mathew |
| 4,935,312 A | 6/1990 | Nakayama et al. |
| 4,959,278 A | 9/1990 | Shimauchi et al. |
| 4,997,516 A | 3/1991 | Adler |
| 4,997,722 A | 3/1991 | Adler |
| 5,008,997 A | 4/1991 | Phy |
| 5,039,576 A | 8/1991 | Wilson |
| 5,049,718 A | 9/1991 | Spletter et al. |
| 5,130,275 A | 7/1992 | Dion |
| 5,160,422 A | 11/1992 | Nishimura et al. |
| 5,202,179 A | 4/1993 | Kasahara |
| 5,234,513 A | 8/1993 | Inoue et al. |
| 5,260,849 A | 11/1993 | Kasahara |
| 5,277,756 A | 1/1994 | Dion |
| 5,320,737 A | 6/1994 | Chao et al. |
| 5,322,823 A | 6/1994 | Ueda et al. |
| 5,384,204 A | 1/1995 | Yumoto et al. |
| 5,393,573 A | 2/1995 | MacKay |
| 5,439,639 A | 8/1995 | Vianco et al. |
| 5,492,595 A | 2/1996 | Carano et al. |
| 5,698,087 A | 12/1997 | Bokisa |
| 5,724,727 A | 3/1998 | Chopra et al. |
| 5,730,851 A | 3/1998 | Arrowsmith et al. |
| 5,750,017 A | 5/1998 | Zhang |
| 5,798,286 A | 8/1998 | Faraci et al. |
| 5,807,519 A | 9/1998 | Suzuki et al. |
| 5,861,076 A | 1/1999 | Adlam et al. |
| 5,879,568 A | 3/1999 | Urasaki et al. |
| 5,889,083 A | 3/1999 | Zhu et al. |
| 5,990,197 A | 11/1999 | Escano et al. |
| 6,010,771 A | 1/2000 | Isen et al. |
| 6,093,503 A | 7/2000 | Isoyama et al. |
| 6,099,713 A | 8/2000 | Yanada et al. |
| 6,139,777 A | 10/2000 | Omoya et al. |
| 6,147,400 A | 11/2000 | Faraci et al. |
| 6,165,386 A * | 12/2000 | Endo et al. ................. 252/500 |
| 6,191,191 B1 | 2/2001 | Harada et al. |
| 6,200,732 B1 | 3/2001 | Tamura et al. |
| 6,238,847 B1 | 5/2001 | Axtell et al. |
| 6,248,455 B1 | 6/2001 | Adams et al. |
| 6,297,142 B1 | 10/2001 | Mita et al. |
| 6,306,947 B1 | 10/2001 | Morishima et al. |
| 6,348,125 B1 * | 2/2002 | Geusic ................. C23G 5/00 |
| | | 156/345.5 |
| 6,361,823 B1 | 3/2002 | Bokisa et al. |
| 6,426,548 B1 | 7/2002 | Mita et al. |
| 6,433,409 B2 | 8/2002 | Mita et al. |
| 6,472,459 B2 | 10/2002 | Morales et al. |
| 6,530,944 B2 | 3/2003 | West et al. |
| 6,554,914 B1 | 4/2003 | Rozbicki et al. |
| 6,583,500 B1 | 6/2003 | Abbott et al. |
| 6,603,205 B2 | 8/2003 | Miura |
| 6,638,847 B1 | 10/2003 | Cheung et al. |
| 6,646,330 B2 | 11/2003 | Kubara et al. |
| 6,651,521 B2 | 11/2003 | Carbone et al. |
| 6,664,492 B1 | 12/2003 | Babb et al. |
| 6,679,937 B1 | 1/2004 | Kodas et al. |
| 6,682,584 B2 | 1/2004 | Pozarnsky et al. |
| 6,720,499 B2 | 4/2004 | Bokisa et al. |
| 6,773,827 B2 | 8/2004 | Higuchi |
| 6,773,828 B1 | 8/2004 | Ooi et al. |
| 6,774,036 B2 | 8/2004 | Goldstein |
| 6,783,569 B2 | 8/2004 | Cheon et al. |
| 6,828,660 B2 | 12/2004 | Abbott |
| 6,860,981 B2 | 3/2005 | Schetty, III et al. |
| 6,899,775 B2 | 5/2005 | Hill et al. |
| 6,917,098 B1 | 7/2005 | Yamunan |
| 6,951,666 B2 | 10/2005 | Kodas et al. |
| 7,019,391 B2 | 3/2006 | Tran |
| 7,062,848 B2 * | 6/2006 | Pan et al. ................. 29/825 |
| 7,084,067 B2 | 8/2006 | Geusic et al. |
| 7,087,523 B2 | 8/2006 | Grigoropoulos et al. |
| 7,153,775 B2 | 12/2006 | Geusic |
| 7,160,629 B2 | 1/2007 | Crosby |
| 7,179,362 B2 | 2/2007 | Dietterle et al. |
| 7,195,702 B2 | 3/2007 | Bokisa, Sr. et al. |
| 7,215,014 B2 | 5/2007 | Su et al. |
| 7,252,699 B2 | 8/2007 | Perry et al. |
| 7,262,603 B1 | 8/2007 | Benton et al. |
| 7,294,366 B2 | 11/2007 | Renn et al. |
| 7,297,902 B2 | 11/2007 | Weiss |
| 7,316,725 B2 | 1/2008 | Kodas et al. |
| 7,351,667 B2 | 4/2008 | Hwang et al. |
| 7,357,681 B2 | 4/2008 | Yamagami et al. |
| 7,384,862 B2 | 6/2008 | Yamazaki et al. |
| 7,391,116 B2 | 6/2008 | Chen et al. |
| 7,482,540 B2 | 1/2009 | Shukushima et al. |
| 7,507,618 B2 | 3/2009 | Dunbar |
| 7,514,369 B2 | 4/2009 | Li et al. |
| 7,547,479 B2 | 6/2009 | Wessling |
| 7,776,196 B2 | 8/2010 | Fujimoto et al. |
| 7,786,024 B2 | 8/2010 | Stumbo et al. |
| 7,867,413 B2 | 1/2011 | Lee et al. |
| 7,879,131 B2 | 2/2011 | Yaniv et al. |
| 7,976,733 B2 | 7/2011 | Chopra et al. |
| 8,647,979 B2 | 2/2014 | Yaniv et al. |
| 8,911,823 B2 | 12/2014 | Li et al. |
| 2002/0148386 A1 | 10/2002 | Woosman et al. |
| 2002/0158342 A1 | 10/2002 | Tuominen et al. |
| 2002/0185716 A1 | 12/2002 | Abys et al. |
| 2002/0187364 A1 | 12/2002 | Heber et al. |
| 2002/0192492 A1 | 12/2002 | Abys |
| 2003/0025182 A1 | 2/2003 | Abys et al. |
| 2003/0151030 A1 | 8/2003 | Gurin |
| 2003/0168639 A1 | 9/2003 | Cheon et al. |
| 2003/0213614 A1 | 11/2003 | Furusawa |
| 2003/0226758 A1 | 12/2003 | Egli |
| 2004/0026256 A1 | 2/2004 | Lindgren |
| 2004/0026684 A1 | 2/2004 | Empedocles |
| 2004/0118696 A1 | 6/2004 | Zhang et al. |
| 2004/0131934 A1 | 7/2004 | Sugnaux et al. |
| 2004/0132299 A1 | 7/2004 | Matsuda et al. |
| 2004/0134379 A1 | 7/2004 | Wong et al. |
| 2004/0147113 A1 | 7/2004 | Yamazaki et al. |
| 2004/0147618 A1 | 7/2004 | Lee et al. |
| 2004/0171211 A1 | 9/2004 | Lee et al. |
| 2004/0175631 A1 | 9/2004 | Crocker et al. |
| 2004/0192042 A1 | 9/2004 | Sirringhaus et al. |
| 2004/0218136 A1 | 11/2004 | Imai et al. |
| 2004/0232000 A1 | 11/2004 | Crosby |
| 2004/0241532 A1 | 12/2004 | Kim |
| 2004/0256239 A1 | 12/2004 | Whitlaw et al. |
| 2005/0019543 A1 | 1/2005 | Lyles |
| 2005/0026423 A1 | 2/2005 | Yamazaki |
| 2005/0078158 A1 | 4/2005 | Magdassi et al. |
| 2005/0097987 A1 | 5/2005 | Kodas et al. |
| 2005/0145502 A1 | 7/2005 | Schetty, III et al. |
| 2005/0148164 A1 | 7/2005 | Casey et al. |
| 2005/0183768 A1 | 8/2005 | Roscheisen et al. |
| 2005/0218398 A1 | 10/2005 | Tran |
| 2005/0230042 A1 | 10/2005 | Hashimoto |
| 2005/0249967 A1 | 11/2005 | Egli |
| 2005/0249968 A1 | 11/2005 | Xu et al. |
| 2005/0249969 A1 | 11/2005 | Xu et al. |
| 2005/0274480 A1 | 12/2005 | Barsoum et al. |
| 2006/0001726 A1 | 1/2006 | Kodas et al. |
| 2006/0011267 A1 | 1/2006 | Kay et al. |
| 2006/0054668 A1 | 3/2006 | Severin |
| 2006/0057502 A1 | 3/2006 | Okada et al. |
| 2006/0062701 A1 | 3/2006 | Nakamura et al. |
| 2006/0068218 A1 | 3/2006 | Hooghan |

(56) References Cited

U.S. PATENT DOCUMENTS

| | | |
|---|---|---|
| 2006/0073680 A1 | 4/2006 | Han et al. |
| 2006/0082952 A1 | 4/2006 | Ogiwara |
| 2006/0090819 A1 | 5/2006 | Egli |
| 2006/0091121 A1 | 5/2006 | Zanolli et al. |
| 2006/0096867 A1 | 5/2006 | Bokisa et al. |
| 2006/0110424 A1 | 5/2006 | Lyles |
| 2006/0111467 A1 | 5/2006 | Reinhardt et al. |
| 2006/0116000 A1 | 6/2006 | Yamamoto |
| 2006/0141268 A1* | 6/2006 | Kalkan et al. ............... 428/446 |
| 2006/0159838 A1 | 7/2006 | Kowalski et al. |
| 2006/0163743 A1 | 7/2006 | Kuwabara et al. |
| 2006/0163744 A1 | 7/2006 | Vanheusden et al. |
| 2006/0183055 A1 | 8/2006 | O'Neill et al. |
| 2006/0189113 A1 | 8/2006 | Vanheusden et al. |
| 2006/0234519 A1 | 10/2006 | Pan et al. |
| 2006/0240591 A1 | 10/2006 | Grier et al. |
| 2006/0286301 A1 | 12/2006 | Murata et al. |
| 2007/0007144 A1 | 1/2007 | Schetty, III |
| 2007/0040191 A1 | 2/2007 | Bezryadin et al. |
| 2007/0051927 A1 | 3/2007 | Itoh et al. |
| 2007/0074316 A1 | 3/2007 | Alden et al. |
| 2007/0095879 A1 | 5/2007 | Holmes |
| 2007/0105395 A1 | 5/2007 | Kinzel et al. |
| 2007/0117475 A1 | 5/2007 | Tu |
| 2007/0144305 A1 | 6/2007 | Jablonski et al. |
| 2007/0145375 A1 | 6/2007 | Cho |
| 2007/0148972 A1 | 6/2007 | Hara et al. |
| 2007/0158204 A1 | 7/2007 | Taylor et al. |
| 2007/0163643 A1 | 7/2007 | Van Duren |
| 2007/0166453 A1 | 7/2007 | Van Duren et al. |
| 2007/0175296 A1 | 8/2007 | Subramanian et al. |
| 2007/0176991 A1 | 8/2007 | Arai et al. |
| 2007/0190326 A1 | 8/2007 | Perry et al. |
| 2007/0218312 A1 | 9/2007 | Sakuyama et al. |
| 2007/0275262 A1 | 11/2007 | Lin et al. |
| 2007/0281136 A1* | 12/2007 | Hampden-Smith et al. ............ 428/195.1 |
| 2007/0281249 A1 | 12/2007 | Tutt et al. |
| 2007/0284700 A1 | 12/2007 | Jackson et al. |
| 2007/0287022 A1 | 12/2007 | Jackson et al. |
| 2007/0287023 A1 | 12/2007 | Jackson et al. |
| 2007/0287024 A1 | 12/2007 | Jackson et al. |
| 2007/0289483 A1 | 12/2007 | Cho et al. |
| 2007/0295530 A1 | 12/2007 | Jackson et al. |
| 2008/0020208 A1 | 1/2008 | Lee et al. |
| 2008/0020304 A1 | 1/2008 | Schroder et al. |
| 2008/0075934 A1 | 3/2008 | Barlow et al. |
| 2008/0083950 A1 | 4/2008 | Pan et al. |
| 2008/0143906 A1 | 6/2008 | Allemand et al. |
| 2008/0164557 A1 | 7/2008 | Kim et al. |
| 2008/0169122 A1 | 7/2008 | Shiraishi et al. |
| 2008/0193667 A1 | 8/2008 | Garbar et al. |
| 2008/0241391 A1 | 10/2008 | Kim et al. |
| 2008/0241414 A1 | 10/2008 | Kim et al. |
| 2008/0264205 A1 | 10/2008 | Zeng et al. |
| 2008/0278181 A1 | 11/2008 | Zhong et al. |
| 2008/0286488 A1 | 11/2008 | Li et al. |
| 2008/0305268 A1 | 12/2008 | Norman et al. |
| 2009/0029148 A1* | 1/2009 | Hashimoto .......... B01J 13/0043 428/323 |
| 2009/0142481 A1 | 6/2009 | Chopra et al. |
| 2009/0286383 A1 | 11/2009 | Jiang et al. |
| 2010/0000762 A1 | 1/2010 | Yang et al. |
| 2010/0035375 A1 | 2/2010 | Grigoropoulos et al. |
| 2011/0043965 A1 | 2/2011 | Yaniv et al. |
| 2011/0300305 A1 | 12/2011 | Li et al. |
| 2012/0049384 A1 | 3/2012 | Yaniv et al. |
| 2014/0302255 A1 | 10/2014 | Spicer et al. |
| 2014/0314966 A1 | 10/2014 | Fink et al. |

FOREIGN PATENT DOCUMENTS

| | | |
|---|---|---|
| CN | 101065203 | 10/2007 |
| CN | 101116149 | 1/2008 |
| EP | 1626106 A2 | 2/2006 |
| EP | 1626106 A3 | 8/2006 |
| EP | 1758166 A2 | 2/2007 |
| EP | 2045028 | 4/2009 |
| EP | 2150417 | 2/2010 |
| EP | 1758166 A3 | 9/2011 |
| JP | 62124084 | 6/1987 |
| JP | S63-237497 | 10/1988 |
| JP | 10-308119 | 11/1998 |
| JP | 11-319538 | 11/1999 |
| JP | 2001-325831 | 11/2001 |
| JP | 2003-292836 | 10/2003 |
| JP | 2004-127676 | 4/2004 |
| JP | 2004-273592 | 9/2004 |
| JP | 2005-307335 | 11/2005 |
| JP | 2006-026602 | 2/2006 |
| JP | 2006-038999 | 2/2006 |
| JP | 2006-169592 | 6/2006 |
| JP | 2006-186330 | 7/2006 |
| JP | 2006-229212 | 8/2006 |
| JP | 2006-321948 | 11/2006 |
| JP | 2007-042725 | 2/2007 |
| JP | WO 2007034922 A1 * | 3/2007 .......... B01J 13/0043 |
| JP | 2007-321215 | 12/2007 |
| JP | 2007-327058 | 12/2007 |
| JP | 2007-332347 | 12/2007 |
| JP | 2008006513 | 1/2008 |
| JP | 2009-097082 | 5/2009 |
| WO | 97/08924 | 3/1997 |
| WO | 03106573 A1 | 12/2003 |
| WO | 2004005413 A1 | 1/2004 |
| WO | 2006/071419 | 7/2006 |
| WO | 2006/076603 | 7/2006 |
| WO | 2006072959 | 7/2006 |
| WO | 2007/004033 | 1/2007 |
| WO | 2007/013393 | 2/2007 |
| WO | 2008/144504 | 11/2008 |
| WO | 2009/111393 | 9/2009 |

OTHER PUBLICATIONS

International Search Report and Written Opinion, PCT/US09/49510, dated Oct. 19, 2009.

International Preliminary Report on Patentability, International Application No. PCT/US2009/044196, dated Nov. 25, 2010, 6 pages.

International Preliminary Report on Patentability, International Application No. PCT/US2009/044195, dated Nov. 25, 2010, 5 pages.

International Preliminary Report on Patentability, PCT/US2008/063890, dated Dec. 3, 2009.

International Search Report and Written Opinion of the International Searching Authority, or the Declaration for PCT/US10/28799, dated May 19, 2010.

International Search Report and the Written Opinion on the International Searching Authority for PCT/US10/28811, dated May 18, 2010.

Schroder et al. "Broadcast Photonic Curing of Metallic Nanoparticle Films" Nanotechnologies, Inc. publication, 4 pages.

Lu et al. "Ultra Strength and High Electrical Conductivity in Copper" Science Magazine, Apr. 2004, vol. 304, 6 pgs.

Volkman et al. "Ink jetted Silver/Copper Conductors for printed RFID Applications" Materials Research Society magazine, 2004, vol. 814, 6 pgs.

Wu et al. "One-Step Green Route to Narrowly Dispersed Copper Nanocrystals" Journal of Nanoparticle Research, 2006, pp. 965-969, 5 pages.

Curtis et al. "Spray and Inkjet Printing of Hybrid Nanoparticle-Metal-Organic Inks for Ag and Chu Metallizations" Materials Research Society magazine, 2001, vol. 676, 6 pages.

Shacham-Diamond "Electroless Copper Deposition Using Glyoxylic Acid as Reducing Agent for Ultralarge Scale Integration Metallization" manuscript published by Electrochemical and Solid-State Letters, Apr. 2000, pp. 279-282, 4 pages.

(56) References Cited

OTHER PUBLICATIONS

Yeshchenko et al. "Size-Dependent Melting of Spherical Copper Nanoparticles" article published by National Taras Shevchenko Kyiv University, Jan. 2007, 16 pgs.
Virang G. Shah, "Trimming and Printing of Embedded Resistors Using Demand-Mode Ink-Jet Technology and Conductive Polymer," IPC Printed Circuit Expo (2002) pp. 1-5.
International Search Report for PCT/US08/63890 dated Aug. 6, 2008, 9 pgs.
International Search Report and Written Opinion for Application No. PCT/US/09/35717, dated May 5, 2009, 7 pages.
Niizeki et al. "Laser Sintering of Ag Nanopaste Film and Its Application to Bond-Pad Formation," 2008 Electronic Components and Technology Conference, IEEE, pp. 1745-1750.
Lee et al. "Spontaneous Growth Mechanism of Tin Whiskers," Acta mater. vol. 46, No. 10, pp. 3701-3714, 1998.
Gaylon, "Annotated Tin Whisker Bibliography and Anthology," IEEE Transactions on Electronics Packaging Manufacturing, vol. 28, No. 1, Jan. 2005, pp. 94-122.
Lal et al., "Role of Intrinsic Stresses in the Phenomena of Tin Whiskers in Electrical Connectors," IEEE Transactions on Electronics Packing Manufacturing, vol. 28, No. 1, Jan. 2005, pp. 63-74.
Boettinger et al., "Whisker and Hillock Formation on Sn, Sn—Cu and Sn—Pb Electrodeposits," Acta Materialia, 53, Sep. 8, 2005, pp. 5033-5050.
Mitooka et al., "Effect of Laser Irradiation on Generation and Growth of Whiskers in Tin-Electroplated Film," J. Japan Inst. Metals, vol. 73, No. 3, (2009), pp. 226-233.
Osenbach et al., "Sn Corrosion and Its Influence on Whisker Growth," IEEE Transactions on Electronic Packaging Manufacturing, vol. 30, No. 1, Jan. 2007, pp. 23-35.
Osenbach et al., "Sn Whiskers: Material, Design, Processing, and Post-Plate Reflow Effects and Development of an Overall Phenomenological Theory," IEEE Transactions on electronics Packaging Manufacturing, vol. 28, No. 1, Jan. 2005, pp. 36-62.
Osterman, "Mitigation Strategies for Tin Whiskers," Release 1.0, Aug. 28, 2002, 11 pages.
Schroeder et al., "Tin Whisker Test Method Development," IEEE Transactions Electronics Packaging Manufacturing, vol. 29, No. 4, Oct. 2006, pp. 231-238.
MSDS: Fluorad by 3M, Fluorosurfactant FC-4430, Mar. 2, 2002; 4 pages; www.3m.com/paintsandcoatings.
Supplemental European Search Report; Application No. EP 09774505 dated Jun. 29, 2011.
International Search Report and Written Opinion for International Application No. PCT/US09/44196 dated Jun. 30, 2009, 13 pages.
International Search Report and Written Opinion for International Application No. PCT/US09/44195 dated Jun. 25, 2009, 7 pages.
Notice of the First Office Action, Application No. 200880021733.6 dated Jun. 22, 2011.
Supplementary European Search Report, Application No. EP08755692, dated Aug. 6, 2010.
The State Intellectual Property Office of the People's Republic of China, Notice on Grant of Patent Right For Invention, Application No. 200880021733.6, dated Apr. 20, 2012.
The State Intellectual Property Office of the People's Republic of China, Notice on the First Office Action, Application No. 200980125925.6, dated Mar. 31, 2012, 8 pages, CN.
European Patent Office, Examination Report, Application No. 08 755 692.4, Apr. 13, 2012.
Champion et al.. "Sintering of copper nanopowders under hydrogen: an in situ X-ray diffraction analysis", Materials Science and Engineering A. vol. 360, No. 1-2, Nov. 1, 2003, pp. 258-263.
Kim et al., "Cyclic Properties of Si—Cu/Carbon Nanocomposite Anodes for Li-Ion Secondary Batteries", Journal of the Electrochemical Society, vol. 152, No. 3, pp. A-523-A-526, Jan. 24, 2005. retrieved from internet Aug. 26, 2010.
International Search Report and the Written Opinion of the International Searching Authority for PCT/US10/042169, dated Sep. 7, 2010. 4 pages.
Yaniv, "Novel Inkettable Copper Ink Utilizing Processing Temperatures Under 100 Degrees C Without the Need of Inert Atmosphere", Presentation at Printed Electronics Europe Conference, pp. 1-25, Apr. 7-8, 2009, retrieved from Internet Aug. 26, 2010.
International Preliminary Report on Patentability, PCT/US2010/042169, dated Jan. 17, 2012.
Notice on the First Office Action; Patent Application No. 200980108344.1, dated Jan. 21, 2012.
Korean Intellectual Property Office, Chemistry & Biotechnology Examination Bureau, Notice to File a Response, Patent Application No. 10-2010-7022240, dated May 8, 2012, KR.
European Patent Office, European Search Report, Patent Application No. 09747709.5, dated Mar. 12, 2014.
European Patent Office, European Search Report, Patent Application No. 10756901.4, dated Oct. 10, 2014.
European Patent Office, European Search Report, Patent Application No. 10759242.0, dated Sep. 3, 2014.
European Patent Office, Examination Report, Patent Application No. 09774505.3, dated Sep. 26, 2012.
European Patent Office, Examination Report, Patent Application No. 09774505.3, dated Oct. 22, 2014.
International Searching Authority, International Search Report and the Written Opinion for International Application No. PCT/US10/28811, dated May 18, 2010.
Japanese Patent Office, Decision on Rejection, Japanese Patent Application No. 2011-509765, dated Sep. 29, 2014.
Japanese Patent Office, Decision on Rejection, Japanese Patent Application No. 2012-503530, dated Jun. 22, 2015.
Japanese Patent Office, Decision to Reject the Amendments and Decision of Rejection, Japanese Patent Application No. 2010-549783, dated May 19, 2014.
Japanese Patent Office, Final Office Action, Notice of Reasons for Rejection, Japanese Patent Application No. 2012-502281, dated Aug. 11, 2014.
Japanese Patent Office, Final Office Action, Second Office Action, Notice of Reasons for Rejection, Japanese Patent Application No. 2012-503530, dated Jan. 13, 2015.
Japanese Patent Office, Non-Final Office Action, Notice of Reasons for Rejection, Japanese Patent Application No. 2011-516873, dated Mar. 23, 2015, English Translation.
Japanese Patent Office, Non-Final Office Action, Notice of Reasons for Rejection, Japanese Patent Application No. 2013-262239, dated Mar. 30, 2015, English Translation.
Japanese Patent Office, Notice of Reasons for Rejection, Japanese Patent Application No. 2010-549783, dated Dec. 18, 2012.
Japanese Patent Office, Notice of Reasons for Rejection, Japanese Patent Application No. 2012-502281, dated Jul. 16, 2013.
Japanese Patent Office, Notice of Reasons for Rejection, Japanese Patent Application No. 2011-516873, dated Oct. 22, 2013, English Translation.
Japanese Patent Office, Notice of Reasons for Rejection, Japanese Patent Application No. 2010-549783, dated Oct. 15, 2013.
Japanese Patent Office, Notice of Reasons for Rejection, Japanese Patent Application No. 2012-503530, dated Jan. 21, 2014.
Japanese Patent Office, Notice of Reasons for Rejection, Japanese Patent Application No. 2011-516873, dated Mar. 24, 2014.
Japanese Patent Office, Notice of Reasons for Rejection, Japanese Patent Application No. 2010-549783, dated Oct. 14, 2014.
Japanese Patent Office, Office Action, Japanese Patent Application No. 2011-509765, dated Jul. 23, 2013.
Korean Intellectual Property Office, Non-Final Office Action and Translation, Patent Application No. 10-2011-7002542, dated Jun. 18, 2015.
Korean Intellectual Property Office, Notice of Final Rejection, Patent Application No. 10-2010-7022240, dated Dec. 28, 2012, KR.
Korean Intellectual Property Office, Translation of Final Preliminary Rejection, Patent Application No. 10-2013-7010865, dated Feb. 2, 2015.
Korean Laid-open Patent Publication No. 10-2007-0085253, Aug. 27, 2007.
Korean Laid-open Patent Publication No. 10-2007-0008633, Jan. 17, 2007.

(56) References Cited

OTHER PUBLICATIONS

Korean Laid-open Patent Publication No. 10-2007-0117199, Dec. 12, 2007.
Taiwan International Patent & Law Office, Translation of Office Action and Taiwan IPO Search Report, Taiwan Invention Patent Application No. 0977118130, dated May 31, 2013.
Taiwan International Patent & Law Office, English Translation of Notice on Decision on Rejection, Taiwan Invention Patent Application No. 0977118130, dated Apr. 24, 2014.
Taiwan International Patent & Law Office, English Translation of Notice on Decision on Rejection, Taiwan Invention Patent Application No. 098122418, dated Aug. 18, 2015.
Taiwan International Patent & Law Office, Office Action, Taiwan Invention Patent Application No. 098122418, dated Jul. 15, 2015.
Taiwan International Patent & Law Office, Translation of Notice of Office Action and Search Report, Taiwan Invention Patent Application No. 099109236, dated Oct. 23, 2014.
Taiwan International Patent & Law Office, Translation of Notice of Office Action and Search Report, Taiwan Invention Patent Application No. 098116219, dated Oct. 15, 2014.
TEGO 425 FLOW Datasheet; http://evonik.tego.de/pdf/daten/amer/Flow_425.pdf.
The State Intellectual Property Office of the People's Republic of China, Application No. 200980118341.6, Notice on the First Office Action, dated Feb. 17, 2013.
The State Intellectual Property Office of the People's Republic of China, Notice on the Second Office Action and Search Report, Patent Application No. 200980108344.1, dated Dec. 5, 2012.
The State Intellectual Property Office of the People's Republic of China, Notice on the Second Office Action, Application No. 200980125925.6, dated Feb. 25, 2013, 11 pages, CN.
The State Intellectual Property Office of the People's Republic of China, Translated Text of the First Office Action for Application No. 201080015842.4, dated May 6, 2013, 6 pages, CN.
The State Intellectual Property Office of the People's Republic of China, Notice on the First Office Action, Application No. 201080023851.8, dated Jul. 15, 2013, 8 pages, CN.
The State Intellectual Property Office of the People's Republic of China, Notice on the First Office Action, Application No. 201080032626.0, dated Jun. 28, 2013, 7 pages, CN.
The State Intellectual Property Office of the People's Republic of China, Notice on the Third Office Action, Application No. 200980125925.6, dated Nov. 5, 2013, 1 page.
The State Intellectual Property Office of the People's Republic of China, Notice on the Third Office Action; Patent Application No. 200980108344.1, dated Feb. 27, 2014, English Translation.
The State Intellectual Property Office of the People's Republic of China, Translated text of Notice on the Second Office Action; Patent Application No. 201080015842.4, dated Mar. 10, 2014.
The State Intellectual Property Office of the People's Republic of China, Notice on the Second Office Action; Patent Application No. 201080023851.8, dated Apr. 8, 2014.
The State Intellectual Property Office of the People's Republic of China, Notice on the Second Office Action; Patent Application No. 201080032626.0, dated Apr. 16, 2014.
The State Intellectual Property Office of the People's Republic of China, Text of the Third Office Action; Patent Application No. 201080015842.4, dated Sep. 5, 2014.
The State Intellectual Property Office of the People's Republic of China, Notice on the Fourth Office Action; Patent Application No. 200980108344.1, dated Jul. 25, 2014, English Translation.
The State Intellectual Property Office of the People's Republic of China, Fifth Office Action; Patent Application No. 200980108344.1, dated Dec. 29, 2014.
The State Intellectual Property Office of the People's Republic of China, Decision on Rejection and Translation, Application No. 201080023851.8, dated Dec. 11, 2014.
The State Intellectual Property Office of the People's Republic of China, Decision on Rejection, Application No. 201080015842.4, dated Mar. 13, 2015.
The State Intellectual Property Office of the People's Republic of China, Text of the Decision on Rejection, Application No. 201080015842.4, dated Mar. 13, 2015.
U.S., Final Office Action Summary, U.S. Appl. No. 12/391,817, dated Aug. 27, 2012.
U.S., Final Office Action Summary, U.S. Appl. No. 12/496,453, dated Jan. 2, 2013.
U.S., Final Office Action, U.S. Appl. No. 12/121,260, dated Jan. 12, 2015.
U.S., Final Office Action, U.S. Appl. No. 12/121,260, dated Apr. 3, 2012.
U.S., Final Office Action, U.S. Appl. No. 12/391,817, dated Mar. 13, 2013.
U.S., Non-Final Office Action Summary, U.S. Appl. No. 12/496,453, dated Jun. 13, 2012.
U.S., Non-Final Office Action Summary, U.S. Appl. No. 14/073,986, dated Dec. 1, 2014.
U.S., Non-Final Office Action, U.S. Appl. No. 12/466,306, dated Nov. 7, 2012.
U.S., Non-Final Office Action, U.S. Appl. No. 13/260,893, dated Mar. 11, 2013.

* cited by examiner

| ITEM | MANUFACTURER | PARTICLE SIZE-AVG (nm) | POWDER COLOR | INK COLOR | BEST RESISTIVITY ($\mu$OHM-cm) |
|---|---|---|---|---|---|
| 1 | ALPHA AESAR | 40 | BLACK | BLACK | 144 |
| 2 | ALDRICH | 90 | RED BROWN | RED BROWN | 32 |
| 3 | NOVACENTRIX | 50 | RED BROWN | RED BROWN | 92 |
| 4 | JUNYE | 80 | BLACK | BLACK | 480 |
| 5 | JUNYE | 110 | RED BROWN | RED BROWN | 15 |
| 6 | JUNYE | 80 | BROWN | BROWN | 7 |
| 7 | JUNYE | 60 | DARK BROWN | DARK BROWN | 86 |
| 8 | JUNYE | 70 | BROWN | BROWN | 5 |
| 9 | AMERICAN ELEMENTS | 70 | DARK BROWN | DARK BROWN | 28 |
| 10 | FERRO | 120 | RED BROWN | RED BROWN | 6 |
| 11 | CANANO | 50 | DARK DARK BROWN | DARK DARK BROWN | 150 |
| 12 | CANANO | 70 | DARK BROWN | DARK BROWN | 23 |
| 13 | CANANO | 90 | BROWN | BROWN | 15 |

Fig. 8

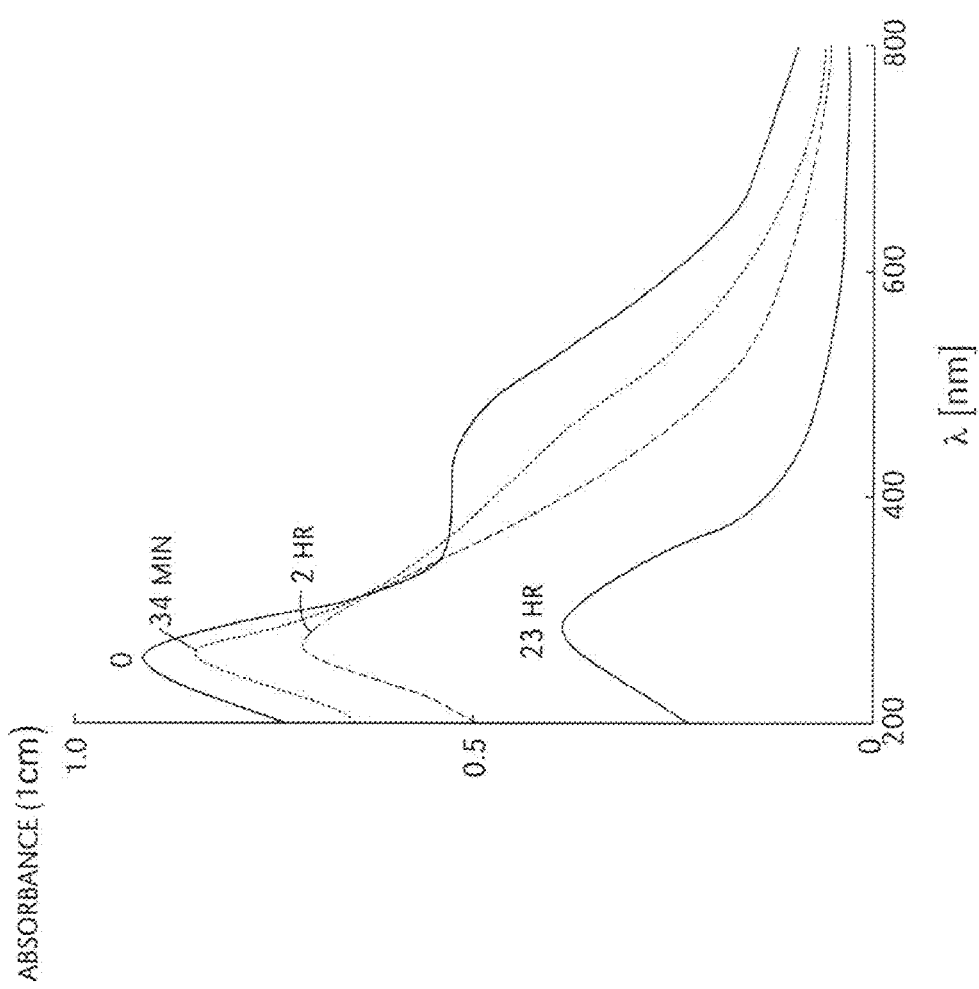

| COPPER NANOPARTICLES (NPs) | SOLUTION | | Cu/Cu2O (NET HEIGHT FROM XRD DATA) |
|---|---|---|---|
| 50 nm SANGYO | IPA, HEXYLAMINE AND NPs | PRE-CURE AT 100°C IN AIR | 2.1 : 1 |
| | | AFTER PHOTONIC CURING | 13 : 1 |
| 80 nm AMERICAN ELEMENTS | IPA, HEXYLAMINE AND NPs | PRE-CURE AT 100°C IN AIR | 2.6 : 1 |
| | | AFTER PHOTONIC CURING (REDDISH ZONES ~1400 V) | 3.6 : 1 |
| | | AFTER PHOTONIC CURING (BLUISH ZONE ~1300 V) | 2.2 : 1 |

Fig. 10

| SAMPLE # | OVEN | DRYING TIME (MIN.) | PRE TEMP. (°C) | POST TEMP. (°C) |
|---|---|---|---|---|
| 1 | AIRFLOW | 30 | 100* | 100* |
| 2 | AIRFLOW | 60 | 100* | 100* |
| 3 | VACUUM | 10 | 93 | 93 |
| 4 | VACUUM | 15 | 93 | 95 |
| 5 | VACUUM | 20 | 95 | 93 |
| 6 | VACUUM | 5 | 125 | 121 |
| 7 | VACUUM | 10 | 121 | 126 |
| 8 | VACUUM | 15 | 126 | 120 |
| 9 | VACUUM | 5 | 152 | 145 |
| 10 | VACUUM | 10 | 145 | 150 |

*THESE VALUES WERE NOT VERIFIED BY AN IR THERMOMETER

| Sample # | Drying Method | Drying Time (min.) | Distance to Lamp (in.) |
|---|---|---|---|
| 1 | Air | N/A | N/A |
| 2 | Airflow Oven | 60 | N/A |
| 3 | Infrared Lamp | 1 | 2 |
| 4 | Infrared Lamp | 5 | 2 |
| 5 | Infrared Lamp | 15 | 6 |
| 6 | Infrared Lamp | 30 | 6 |
| 7 | Infrared Lamp | 15 | 9 |
| 8 | Infrared Lamp | 30 | 9 |
| 9 | Infrared Lamp | 15 | 12 |
| 10 | Infrared Lamp | 30 | 12 |

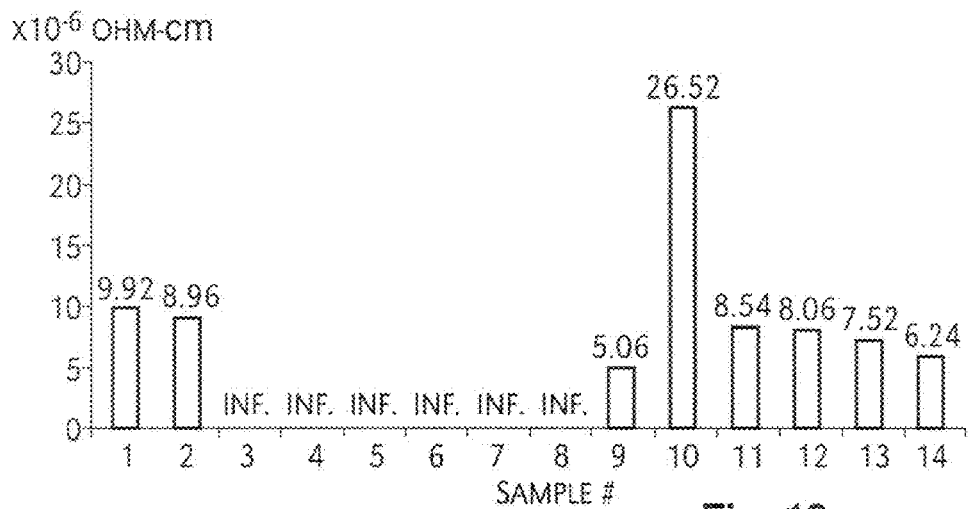
Fig. 18
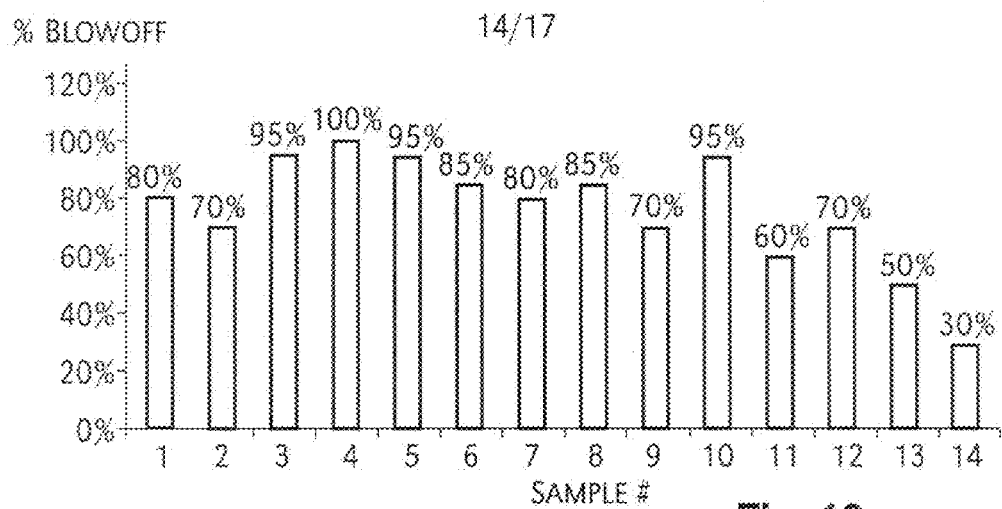
Fig. 19
| SAMPLE # | OVEN | BAKE TIME (MIN.) | POWER LEVEL |
|---|---|---|---|
| 1 | AIRFLOW | 60 | N/A |
| 2 | MICROWAVE | 0.5 | 100% |
| 3 | MICROWAVE | 1 | 100% |
| 4 | MICROWAVE | 2 | 100% |
| 5 | MICROWAVE | 4 | 100% |
Fig. 20

PHOTO-CURING PROCESS FOR METALLIC INKS

This application claims priority to U.S. Provisional Patent Application Ser. Nos. 61/053,574 and 61/169,618, which are hereby incorporated by reference herein.

TECHNICAL FIELD

The present invention relates in general to metallic inks for producing conductive paths for electronic circuitry.

BACKGROUND

The purpose of nanotechnology and science is to understand, control and manipulate objects of a few nanometers in size. These nano-objects are known to behave as an intermediate between single atoms and molecules and bulk matter. These properties are often peculiar and different from the properties of bulk material; in particular, these nano-objects can present properties that vary dramatically with size. This opens the possibility of controlling these properties by precisely controlling their formulation process.

Nanoclusters are aggregates of atoms or molecules with an average diameter less than 100 nm and a number of constituent components ranging from 10 to 106. Nanoclusters do not have a fixed size, structure, or composition. As a result, they present a variety of morphologies. Nanoclusters may be homogeneous, which means composed of only one type of atom or molecule, or heterogeneous. The components within a nanocluster may be held together by very different kinds of forces, such as electro-static, Van der Waals, or covalent bonds, depending on the constituent. Small clusters of metal atoms, such as Cu (copper), are held together by forces more like those of covalent bonds, not like the forces exerted by the nearly free electrons of bulk metals. Clusters containing no more than a few hundred metal atoms, resulting in diameters around 3-5 nanometers, have strong, size-dependent properties due to quantum confinement. As the cluster becomes larger, with diameters up to 100 nanometers, they possess smooth variations of behavior approaching the bulk size limit.

Nanoclusters usually do not have a crystal lattice structure like their bulk counterparts. These finite clusters can present multiple nanocrystalline structures such as multiple hedronic structures with multiple faces. Some nanoclusters may be a crystalline solid. It is important to understand whether crystalline or noncrystalline structures prevail for a given size and composition in order to describe some physical process involving the nanocluster.

An interesting inquiry for consideration is what happens in a phase transition situation, like copper from liquid to solid, when there are nanoclusters. An answer to this question provides that thermodynamic and kinetic energy stabilities influence. Nanoclusters have a very high surface area to volume ratio resulting in a high surface energy. The nanocluster's structure, including facets, edges and vertices, has a strong influence to this surface energy and thus dominates the nanoparticle's behavior.

In order to fully understand the physical behavior of these nanoclusters several steps are taken. First, nanoparticle structure is the starting point for understanding copper nanocluster behavior. In order to gain a very complicated understanding of the structure-property relationship, a deep study of the minimum energetic situations was performed and the results analyzed. These results are very complicated and convoluted and, until now, have not been done by anyone in the world for copper nanoclusters. Second, is to determine the effect of increased temperature. To answer this question, one must be an expert in the thermodynamics of finite systems. There are very few experts in the world. Third, one needs to understand, in particular for phase transition of copper nanoclusters, what is the time scale in the experimental setting vs. the time scale of morphology transitions. Basically, this is solved by the study of kinetic effects in the formation and destruction of nanoclusters.

BRIEF DESCRIPTION OF THE DRAWINGS

FIG. 8 illustrates correlations between average particle size, powder color, ink color, and resistivity after photocuring;

FIG. 9 illustrates absorption spectrum of an aged Cd solution before (O) and at various times after exposure to nitrous oxide;

FIG. 10 illustrates evidence of reduction of copper oxide to metallic copper in a photo-curing process;

FIG. 18 illustrates that the electrical properties for samples 5 and 7-10 are better than that of sample 2;

FIG. 19 illustrates the percentage blowoff of the copper from the Kapton during a photosintering step;

FIG. 20 illustrates the drying parameters for each sample;

DETAILED DESCRIPTION

Surface Structure of Copper Nanoclusters

In general, the binding energy ($E_b$) of a cluster of size N with a given structure can be written in the following form:

$$E_b = aN + bN^{2/3} + cN^{1/3} + d \tag{1}$$

where the first term corresponds to the volume contributions and the other represent surface contributions from facets, edges, and vertices (see, T. L. Hill, "Thermodynamics of Small Systems," Parts I and II, 1964, Benjamin, Amsterdam). Volume and surface contributions are in competition. Clusters with low surface energy will have generally a quasi-spherical shape and close packed facets in order to optimize the surface to volume ratio.

From equation (1), one can define a useful parameter that reflects the stability of the cluster with the size N:

$$\Delta(N) = \frac{E_b(N) - N\varepsilon_{coh}}{N^{2/3}} \tag{2}$$

whereby $\varepsilon_{coh}$ is the cohesive energy per particle in the bulk solid, and $\Delta$ is the excess energy with respect to N atoms in a perfect bulk crystal. For clusters of crystalline structure, the parameter a in equation (1) is simply $\varepsilon_{coh}$ so that:

$$\lim_{N \to \infty} \Delta = E_b \tag{3}$$

Figure 1:
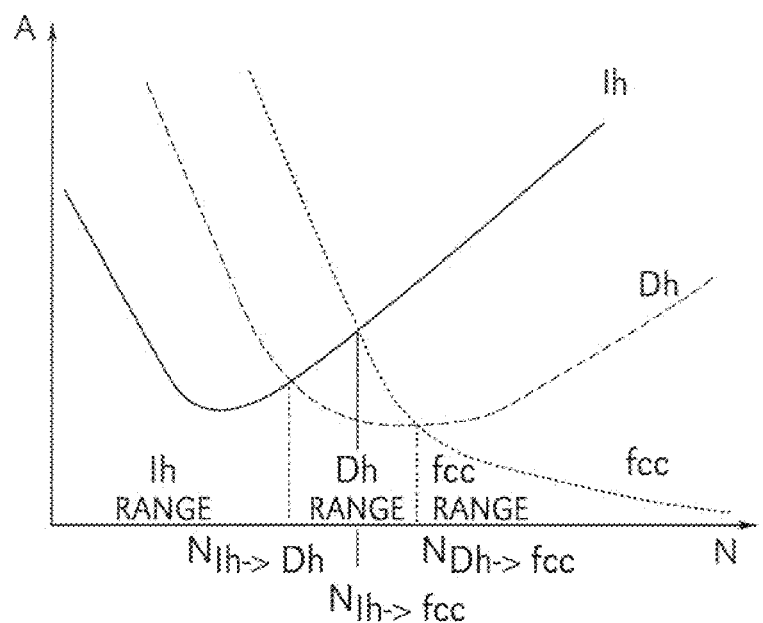
FIG. 1 illustrates qualitative behavior for the excess energy for crystalline, icosahedron and decahedron clusters.

As illustrated in the graph in FIG. 1, in the case of nanocrystalline structures, $\alpha > \varepsilon_{coh}$, and $\Delta$ diverges as large sizes.

It is important to understand, empirically and theoretically, what are the different cluster shapes that a solid copper nanocluster can take in order to exactly emulate and calculate the phase transitions from solid to liquid and from liquid to solid in the fusion process that takes place utilizing photonic curing.

The literature provides solutions for building up different shapes with the lowest energy possible (see, A. L. Mackay, 1962, Acta Crystallogr. 15, 916; Martin, T. P., 1996, Phys. Rep. 273, 199), such as icosahedra (twenty facets) and decahedra (ten facets).

With respect to copper clusters specifically, some work was done (see, Alonso, J. A., 2000, Chem. Rev. (Washington, D.C.) 100, 637) to understand the energetic properties of small copper nanoclusters. For example, it was found that for N<10, there is evidence of possibilities for planar structures (flakes) for small N; as the N grows to around $10^{15}$, the icosahedra is favored over the cubical hedron. To understand the energetics of these clusters, very complicated calculations and studies based on density functional calculations (see, Jug, K., B. Zummerman, and A. M. Kostler, 2002, Int. J. Quantum Chem. 90. 594) or semi-empirical potential calculations (see, Darby, S., T. V. Mortimer-Jones, R. L. Johnson, and C. Roberts, 2002, J. Chem. Phys. 116, 1536; Doye, J. P., and D. J. Wales, 1998b, New J. Chem. 22, 733) must be performed. In any case, all these calculations compared with some few experimental results show for nanoclusters of copper a prevalence for icosahedra, intermediate sized decahedra, and large face cubic center (fcc) clusters.

Size Dependency of the Copper Nanoparticles Melting Point:

An important point is to understand the size dependence of the melting point. The size dependency of a nanocluster melting point for a given material usually shows a monotonic decrease with decrease in size and may also show irregular variations.

Consider a cluster of size N and, for simplicity, of spherical shape, at a given pressure p. It is expected then that the melting temperature will be a function of the size $T_m(N)$. Comparison of $T_m(N)$ with $T_m(\infty)$ is then performed, which is the melting temperature of the bulk material. In the case of photo-curing of copper nanoclusters, it is important to study the solid-liquid transitions of these nanoclusters. In order to find a solution to $T_m(N)$, one needs to equate the chemical potential of the solid and of the liquid and solve the equation:

$$\mu_s(p,T) = \mu_l(p,T) \tag{4}$$

This equation means that the chemical potentials of a fully solid and of a fully liquid cluster are equal at melting. After a number of mathematical manipulations (see, Pawlow, P., 1909, Z. Phys. Chem., Stoechiom. Verwandtschaftsl. 65, 1), one obtains the following equation:

$$T_m(N) = T_m(\infty)\left\{1 - \frac{C}{N^{1/3}}\right\} \tag{5}$$

where C is a constant and depends on the latent heat of melting per particle, the density of the particle, and interface tensions such as at the solid vapor interface and liquid vapor interface.

Figure 2:
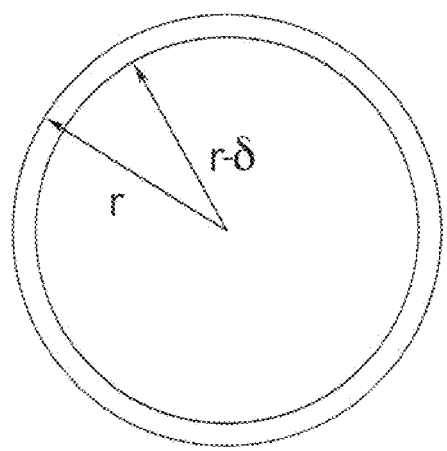
FIG. 2 illustrates a particle with a solid core and a surrounding liquid shell.

This model can be refined by including the possibility of surface melting that may be the case in a photonic curing process. Id. In this case, the melting process is considered to start at the surface of a nanocluster as illustrated in FIG. 2.

The melting temperature is found by imposing the equilibrium condition on the solid core/liquid shell particle. This model is even further complicated and expanded (see, Kofman, R., P. Cheyssac, A. Aouaj, Y. Lereah, G. Deutscher, T. Ben-David, J. M. Pennison, and A. Bourret, 1994, Surf. Sci. 303, 231) for metallic particles, specifically. In this case, a new variable $\xi$ is introduced that is characteristic to the length of the interaction among atoms and liquid metals in addition to taking into account the effective interaction between the solid liquid and liquid vapor interfaces. This effective interaction is repulsive and favors the formation of a liquid shell between the solid core and the vapor as illustrated in FIG. 2. The equation is much more complex, but it is interesting to see that the simple solution expressed in equation (5) is recovered in the limit $\xi \to 0$.

Figure 3:
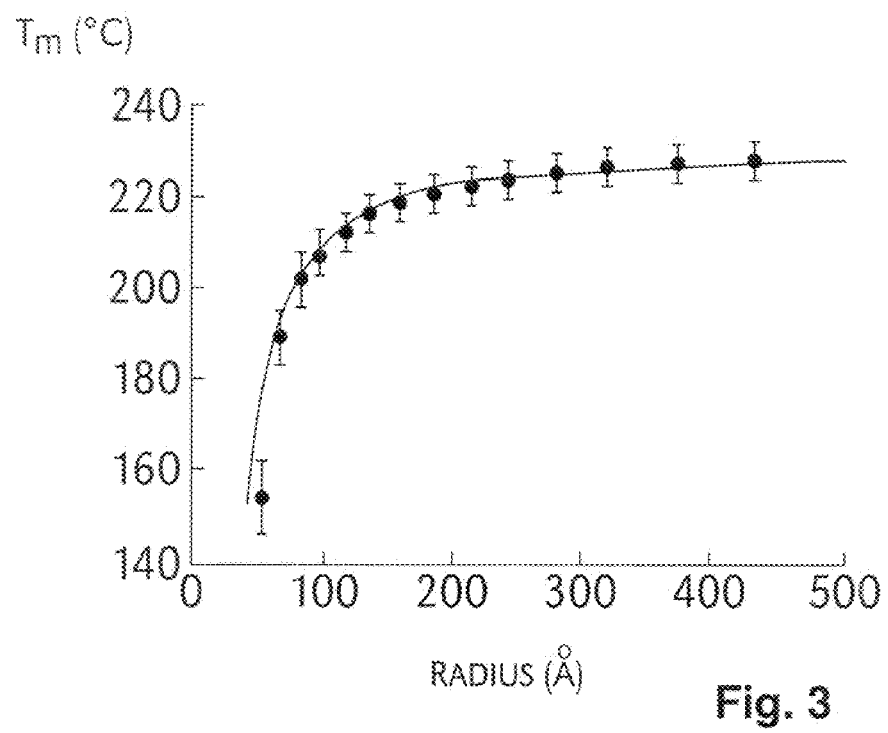
FIG. 3 is a comparison of theoretical and experimental melting points for tin clusters.

It is believed that the solid core/liquid shell model is more accurate and fits the experiment much better. In fact, some researchers (Wang, L., Y. Zhang, X. Bian, and Y. Chen, 2003, Phys. Lett. A 310, 197) discovered that this solid core/liquid shell model fits very well for N=500 for copper. For example, FIG. 3 shows a graph illustrating comparison of theoretical and experimental melting points of tin clusters (see, Lai, S. L., J. Y. Guo, V. Petrova, G. Ramanath, and L. H. Allen, 1996, Phys. Rev. Lett. 77, 99) showing clearly that this approach can theoretically predict the drop in the melting temperature of tin clusters versus size.

Nanoclusters and the Melting Process in Photo-curing:

For the photonic curing process, consider both the melting process of the copper nanoclusters and the formation of the copper nanoclusters in a process of freezing the liquid copper nano-droplets. In particular, the kinetic effects may strongly influence the formation of nanoclusters. An important consideration is the time scale of the copper nanocluster formation. The time scale of nanocluster formation may range from a fraction of a millisecond to a few milliseconds. On this time scale, from the kinetics point of view, clusters may not be able to reach the minimum free energy structure, thus remaining trapped in some meta-stable configuration that has a very long lifetime, especially when the clusters are further cooled down after their solidification, as is the case of the photo-curing process disclosed herein.

In order to build a model and study the formation process of solid clusters of copper in the herein described photo-curing process, solid clusters in contact with a thermal bath are studied. In an embodiment of the present invention, this bath is more complicated, because it includes the substrate and the environment around the substrate.

There are two models for studying the formation of nanoclusters. One is referred to as a liquid state growth model, and is simulated by freezing a liquid droplet until it solidifies, usually at constant N and decreasing T. In the case of copper metal, it is not necessary to take care in this type of calculations of the evaporation of atoms effects, because there are very large differences between melting and boiling points; as a result, the evaporative cooling is negligible.

Another model is referred to as a solid state growth model, and it is simulated by adding single atoms to a small initial seed at constant temperature. In photo-curing of copper nanoclusters, it may not be assumed that the temperature is constant, because there is an effect of freezing of liquid nano-droplets.

A good model is to mimic a thermal contact with the surroundings that is cooler. In such a way, one can take into account the most relevant parameters such as the rate of temperature change. Following this approach (see, Westergren, J., H. Gronbeck, A. Rosen, and S, Nordholm, 1998, J. Chem. Phys. 109, 9848), one can obtain that the change in the temperature is inversely proportional to the radius R of the nanocluster:

$$\frac{\partial T}{\partial t} \propto \frac{1}{R} \quad (6)$$

Figure 4:
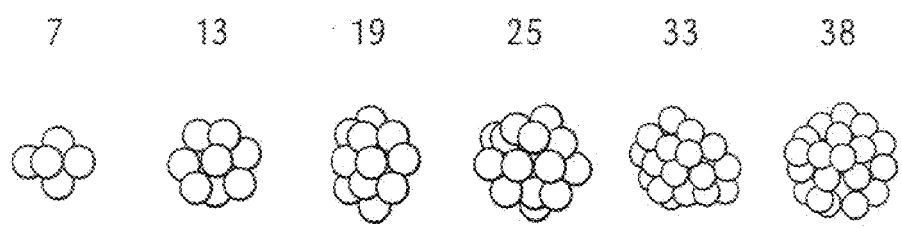
FIG. 4 illustrates growth simulation for copper nanoclusters.

The growth of copper nanoclusters is dominated by polyicosahedral structures, as mentioned above. It is interesting to note that theoretically it was proven that there are some magic sizes, or values of N, that these polyicosahedral structures prefer, meaning they have the most stability. For example, FIG. 4 illustrates the growth process of $Cu_{38}$ at a temperature of 400° K.

Anomalous Heat Capacity of Nanoparticles and the Photo-curing Process

To understand the photo-curing process, one takes into account the anomalous heat capacity of nanoparticles (see, Likhachev, V. N, et al, Anomalous heat capacity of nanoparticles, Phys. Lett. A 357, 236). The question is why one should expect at all an anomalous heat capacity behavior of nanoclusters or nanoparticles. Under most circumstances, such a heat capacity is qualitatively similar to that of the bulk counterpart. The problem is, however, that in the formation of the nanoclusters or their melting, there is a region of coexistence of two or more phases. This issue can create some peculiar behavior of heat capacity. In the photo-curing process, there is a situation of phase changes of nanoclusters. The thermodynamics of such small systems is outside the range of the regular textbook of thermodynamics.

Refer to the equilibrium for two phases for understanding. The equilibrium between two phases, whether in a bulk form or nanocluster form, can be described by an equilibrium constant:

$$K_{eq}(T)=\exp(-\Delta\Delta F/KT) \quad (7)$$

whereby $\Delta F$ is the free energy difference between the solid and the liquid. However, it is known that:

$$\Delta F=N\Delta\mu \quad (8)$$

And as a result, the equilibrium constant can be expressed as:

$$K_{eq}(T)=\exp(-N\Delta\mu/KT) \quad (9)$$

where N is the number of particles in the system, and $\Delta\mu$ is the mean difference in the chemical potentials of the two phases.

Hence, even if $\Delta\mu/KT$ is very small (approximately $10^{-10}$), but N is of order of $10^{20}$, then the thermodynamically unfavored phase is so unfavored that it is simply unobservable. However, if N is of order of 10 or 1000, then as long as each phase persists long enough to establish conventional properties by which it is recognized as such, it can be quite easy to find ranges of temperatures and pressure in which two or more phases may coexist in thermodynamic equilibrium. Indeed, as discussed above, in the case of copper nanocluster melting or freezing, there may be situations where isomers may coexist, which as a result may induce the anomalous heat capacity behavior. This is taken into account, as well as other variables, when modeling the photonic curing as temperature induced phase transitions in copper nanoclusters. This type of modeling uses extensive molecular dynamics (MD) and jump-walking Monte Carlo (MC) simulations (see, Proykova, A., et al., "Temperature induced phase transformations of molecular nanoclusters," Vacuum, 68 (2003), 87), which needs to treat solid-solid transformation, solid-liquid transformation, and cooling below the solidification point phenomena. This is very complex and uses several millions of configurations and averaging these simulations over different clusters with the same size. This type of calculation and modeling is out of the scope of the photonic curing experimentations.

The complication of the modeling is even more extensive if one takes into account coalescence. The process is so complex that one must consider the coalescence between two solid clusters, a liquid and a solid cluster and two liquid clusters; while the coalescence of two liquid clusters takes place rapidly, the process of coalescence of two solid clusters takes much longer.

In any case, researchers concluded that coalescence of two solid clusters is very complex, takes place on a very slow time scale and may involve either the formation of a single domain cluster or complicated structures presenting grains (see, Zhu, H., 1996, Philos. Mag. Lett. 73, 27). What exactly happens depends on size and structure of the initial clusters, so it may be a function in photo-curing of the initial size of copper nanoparticles that are used.

Absorption Spectra of Nanoparticles:

The photo-curing process, involves a study and analyzation of the light absorption by small metal particles. The theory of light absorption by small particles is described by Mie's formulation (see, Mie, G., Ann. Phys. 1908, 25, 377). The absorption spectrum of particles in a given solvent can be calculated from the optical constants of the bulk metal, although the absorption of the particles is recognized to be often vastly different from that of the bulk metal itself. The simplest case is when the particles are spherical and their size is small compared to the wavelength of light. Furthermore, to simplify, assume that the particles are well separated in the solution. Following Mie's theory, at particle sizes between about 3 and 20 nanometers, there is no strong dependence of the absorption spectra on particle size. This is because at this very small particle size, the mean free path of the electrons of the bulk metals is much larger, and as a result, the most significant term in Mie's formula is due to the dipole term, which depends only on the total metal concentration in the solution, not the particle size. In this case, the absorption coefficient in $mol^{-1} \cdot L \cdot cm^{-1}$ is calculated from the relation:

$$\alpha = \frac{18\pi}{\ln 10} \frac{10^5}{\lambda} \frac{Mn_0^3}{\rho} \frac{\varepsilon_2}{(\varepsilon_1 + 2n_0^2)^2 + \varepsilon_2^2} \quad (10)$$

where:
- $\lambda$ is the wavelength of light in nm;
- M is the molecular weight;
- $\rho$ is the density of the metal;
- $n_0$ is the refractive index of the solvent; and
- $\varepsilon_1, \varepsilon_2$ are the real and the imaginary parts of the dielectric constant of the metal.

An interesting situation is when the size of the particles becomes smaller than the mean free path of the electrons (for silver, 52 nanometers, and for copper, 39 nanometers). In this case, the absorption bands are broadened. The reason is that a size correction is necessary, and the formula equation (10) starts to be size-dependant (see Kreibig, U., J. Phys. F 1974, 4, 999), because $$\varepsilon_2 = \varepsilon_{2(bulk)} + (\omega_p^2/\omega^3)(v_F/R) \quad (11)$$

where:
- $\omega$ is the light frequency;
- $\omega_p$ is the plasmon frequency of the specific metal;
- $v_F$ is the electron velocity at the Fermi level; and
- R is the particle radius.

Basically, the ratio $R/v_F$ is the mean time of the free movement of the electrons in the specific metal particle.

Figure 5:
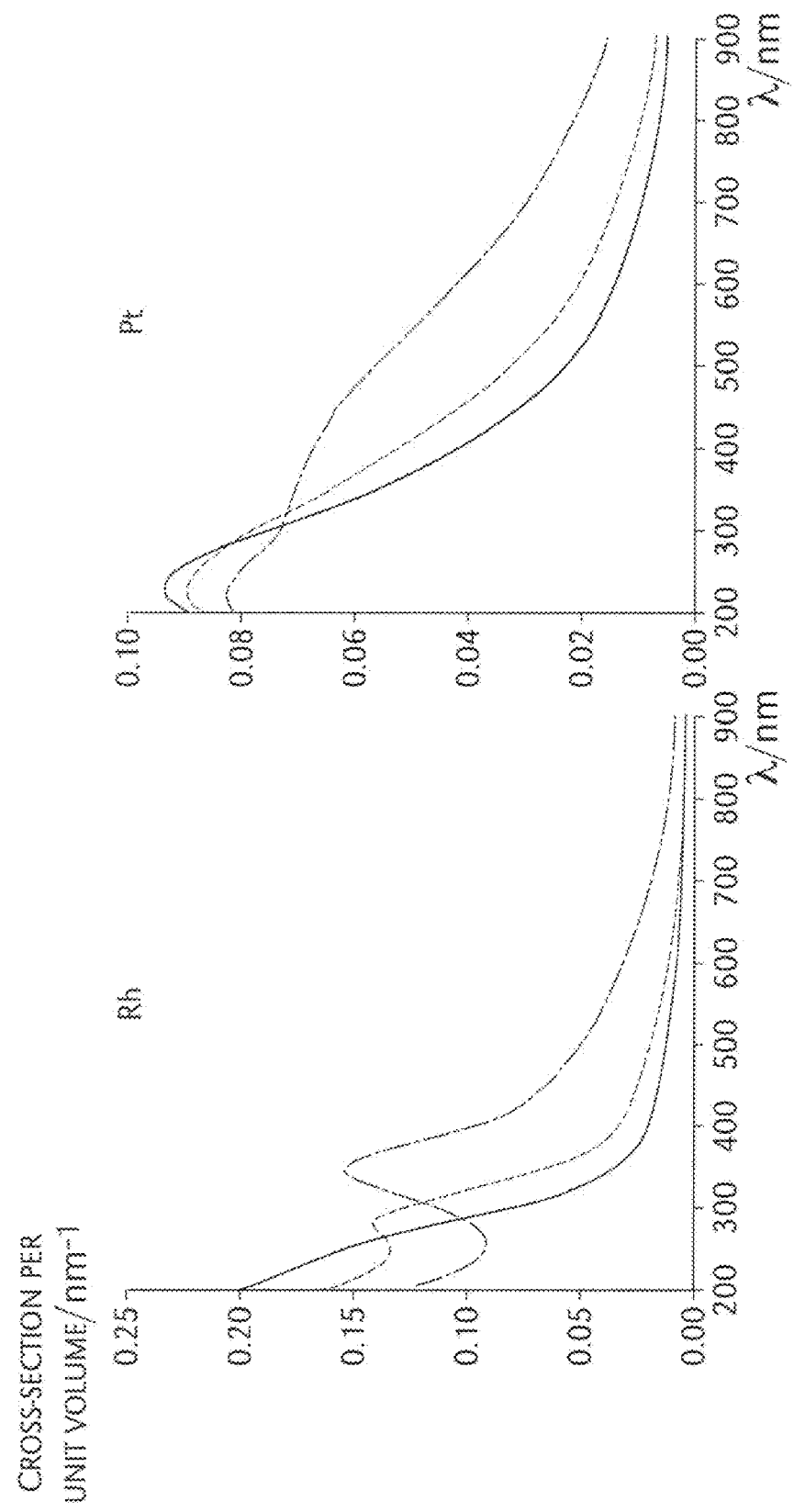
FIG. 5 illustrates graphs of absorption spectra calculated in the dipole approximation for prolate spheroidal Rh and Pt particles in water. The minor diameter of the particles is 10 nm, and the aspect ratios are 1.0 ( - - - ), 2.0 ( - - - ), 3.0 ( - - - )

Extensive modeling and calculations using Mie's formulation were done by Creighton and Eadon (see, Creightoin, J. A., Eadon, D. G. J. Chem. Soc., Faraday Trans. 1991, 87, 3881) (see FIG. 5). FIG. 5 shows, taking into account dipole approximation, a situation that explains well the absorption of metals below a wavelength of 400 nanometers. In order to complete the entire picture of the absorption, one needs to take into account the electronic energy levels and the allowed optical transitions in the specific metal. First of all, one needs to treat the intraband transitions, which in some cases require the participation of a phonon. If this is the case, these intraband transitions will not significantly contribute to the absorption of light. However, an intense absorption is observed in some metallic particles, which peaks at a lower photon energy that is produced by a collective excitation of the free electrons in the particles, as it is illustrated in FIG. 6.

Figure 6:
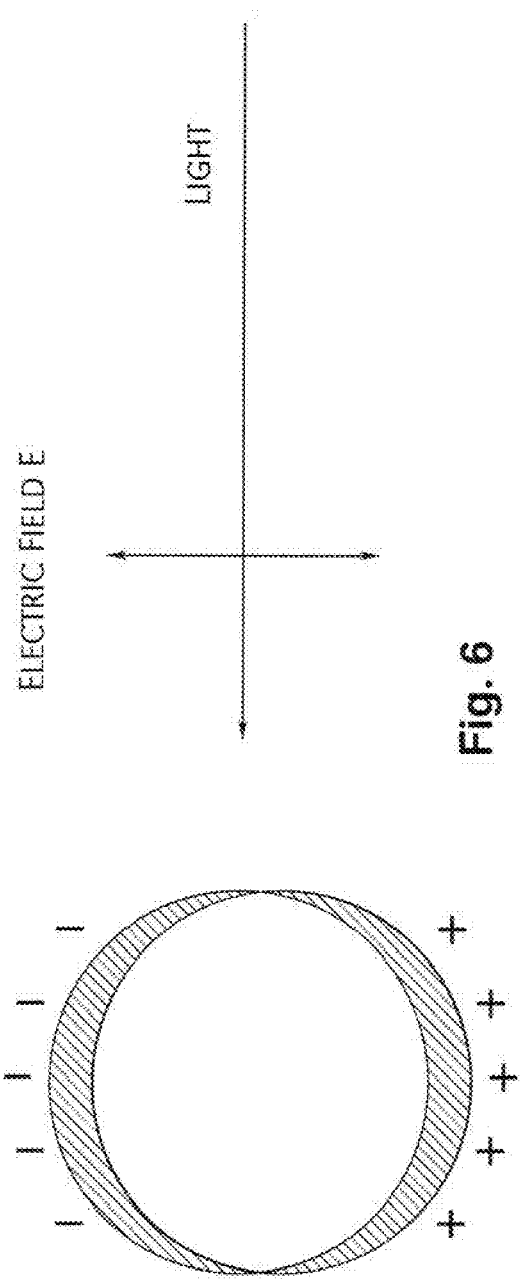
FIG. 6 illustrates polarization of a spherical metal particle by an electrical field vector of the incoming light.

Referring to FIG. 6, the movement of the electrons under the influence of the electric field vector of the incoming light leads to a dipole excitation across the particle sphere. The positive polarization charge then is acting as a restoring force which makes the electrons oscillate. Thus, the electron density within a surface layer of a few angstroms (which is about equal to the screening length) oscillates, while the interior of the particle remains constant. It is important to note that in some cases (such as silver), the excitation of the collective oscillations (plasmon absorption) and the intraband transitions occur at separated wavelength regimes. In the case of copper (as well as gold), the plasmon resonances occur in the visible. However, these resonances are superimposed by intraband transitions.

The contribution of the plasmon oscillation to the absorption of a metal particle can be treated separately. For example, the Mie's equation for the absorption constant is then described as:

$$K = 9\pi N V n_0^3 c \lambda^2 / \sigma[(\lambda_m^2 - \lambda^2)^2 + \lambda^2 \lambda_m^4/\lambda_a^2] \quad (12)$$

where
- K is the absorption constant in $cm^{-1}$, $K = \alpha c \ln 10$, whereby c is the concentration of the metal in moles/liter;
- N is the particle concentration;
- V is the volume per particle;
- $\lambda_m^2 = \lambda_c^2(\varepsilon_0 + 2n_0^2)$ is the wavelength of maximum absorption;
- $\varepsilon_0$ is the high frequency dielectric constant of the metal;
- $\lambda_c$ is the plasma wavelength, $\lambda_c^2 = (2\pi c)^{2\ m}/4\pi N_e e^2$, and is a typical metal property;
- $N_e$ is the density of the free electrons;
- $\lambda_a$ is constant related to the bandwidth at half maximum absorption, $\lambda_m^2/\lambda_a = (\varepsilon_0 + 2n_0^2)c/2\sigma$;
- $\sigma$ is the DC conductivity, $\sigma = N_e e^2 \{r\}/mv_F$;
- M is the effective electron mass;
- $\{r\}$ is mean free path of the electrons in the colloid;
- $1/\{r\} = (1/r + 1/r_\infty)$; and
- $r_\infty$ is the mean free path in the bulk metal.

The relations above indicate that the band position does not depend on the size of the particles. An increase in $N_e$ by adding electrons to the particles' surfaces should lead to a blue shift and a decrease in bandwidth, and consequently, to an increase in the absorption maximum.

Nanoparticles Agglomeration Effects on the Absorption Spectra:

A good comparison between experiment and calculations of observed spectra has been previously possible for a limited number of cases. The main reason is that the metal often does not form isolated particles in colloidal solutions, but agglomerates of a few or even a large number of particles. The agglomeration can drastically change the absorption spectrum. Typical examples are shown in FIG. 7 where absorption spectrums of cadmium and thallium colloids are graphed.

Figure 7:
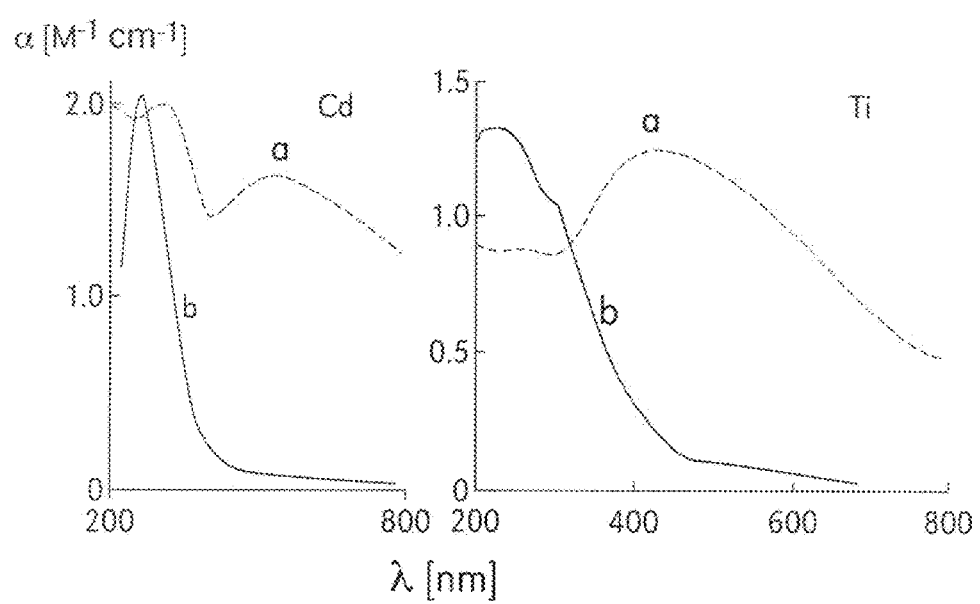
FIG. 7 illustrates absorption spectra of agglomerated (a) and isolated (b) particles of cadmium and thallium in water.

Spectra (a) in FIG. 7 were obtained for solutions which contain agglomerated particles, while Spectra (b) were obtained for solutions prepared under conditions where agglomeration did not occur. Spectra (b) is in good agreement with Mie's formulation and also with the calculated spectrum in FIG. 5.

In view of the description above and the results in FIG. 7, a colloidal metallic substance appears black if the spectrum is similar to the Spectra (a). On the other hand, if the particles are not agglomerated (i.e., good dispersion and good isolation between particles), observed is a more metallic-like color, indicated by Spectra (b).

As summarized in FIG. 8, there is a resulting correlation between average particle size, the powder color, the ink color and the resistivity after curing. Good inks are produced when the color of the powder and the inks are in the red-brown or brown range. When there are very black or very dark looking particles and inks, there is agglomeration.

As the solution is aging, there is a dynamic change of the absorption spectrum from Spectra (b) to Spectra (a) (see FIG. 7). The reason is that at the initial stage there are well-dispersed and isolated copper nanoparticles, while due to the aging process, there will be larger and larger agglomerations. As a result, the color of the copper colloid changes from a metallic red-brownish color to a darker color, eventually transitioning to black.

A very interesting experiment is described (see, Henglein, A., J. Phys. Chem. 1993, 97, 5457-5471) in the spectrum of an aged cadmium (Cd) solution. The aged cadmium solution was exposed to nitrous oxide and then the spectrum was measured as a function of time. The cadmium particles slowly react with $N_2O$ according to the following equation:

$$Cd^0+N_2O+H_2O \rightarrow (Cd^{++}+N_2+2OH^-) \quad (13)$$

As can be seen in FIG. 9, not only the intensity of the absorption decreases during this reaction, but also the shape of the spectrum, with the long wavelength peak rapidly disappearing. The effect is attributed to a phenomenon that occurs frequently in redox reactions of agglomerated colloids color; the agglomerates disintegrated to yield more or less isolated particles. This is attributed to charging of the particles: as the reaction with $N_2O$ is progressing, the particles become positively charged and repel each other.

Copper Oxide to Copper Reduction During the Photo-Curing Process:

Copper nanoparticles (~50 nm) from Sangyo and American Elements (80 nm) are formulated with B1-type ink (IPA, Hexylamie and copper nanoparticles). Both sets of copper nanoparticles contain copper oxides over 20%. Evidence shown in FIG. 10 indicates that photonic curing can photo-reduce copper oxides to metallic copper.

Figure 11A:
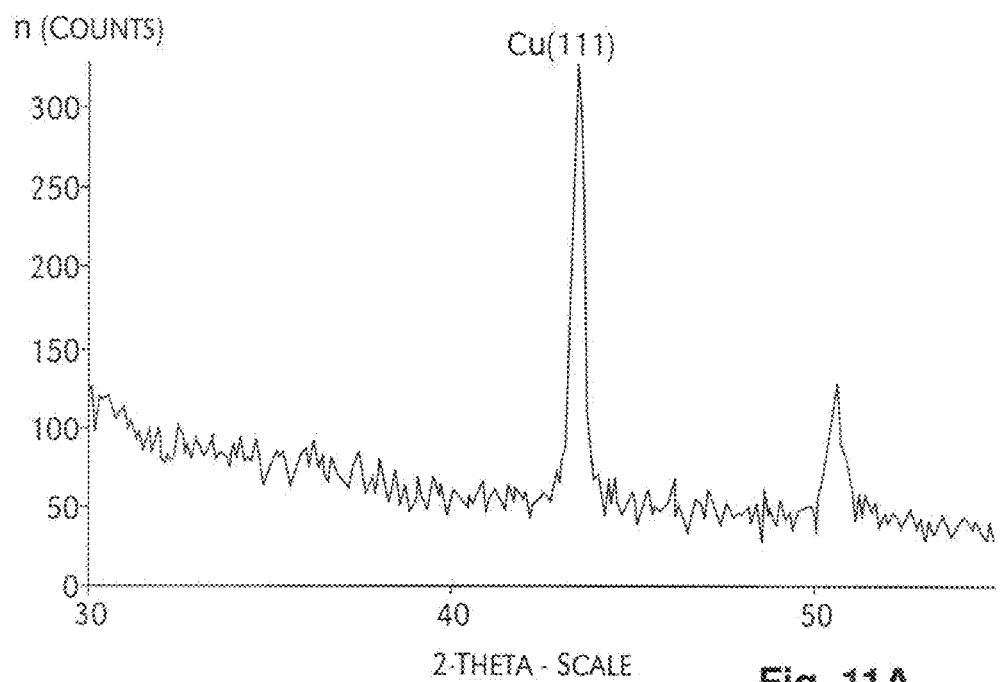
FIG. 11A illustrates Sangyo nanoparticles after photo curing process (the intensity of the $Cu_2O$ peak is significantly reduced; $Cu/Cu_2O$ is 13:1 (7% $Cu_2O$)
Figure 11B:
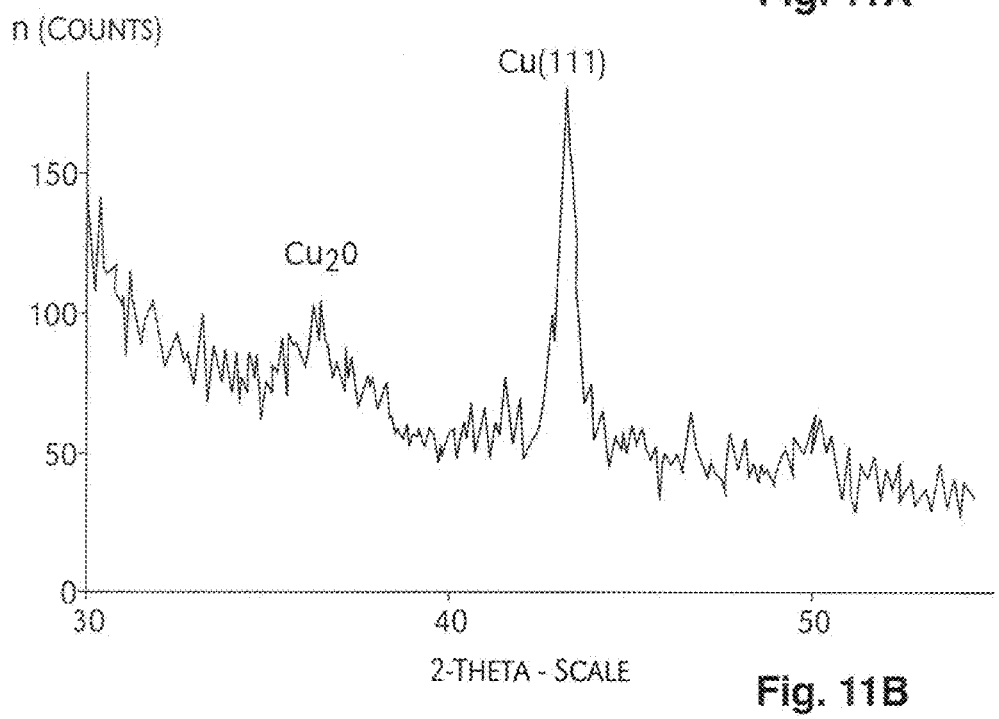
FIG. 11B illustrates Sangyo copper nanoparticles (~50 nm) after pre-curing at 100° C. in air; $Cu/Cu_2O$ is 2.6:1 (28% $Cu_2O$)

With a flash lamp, a threshold energy may exist for photo-reduction of copper oxides. Respective XRDs of the photo-cured inks were executed for both Sangyo and American Elements B1 type ink formulations. FIG. 11B shows the Sangyo copper nanoparticles XRD after precuring at 100° C. in air; observed in FIG. 11A are the changes to the XRD after the photonic curing process.

Figure 12A:
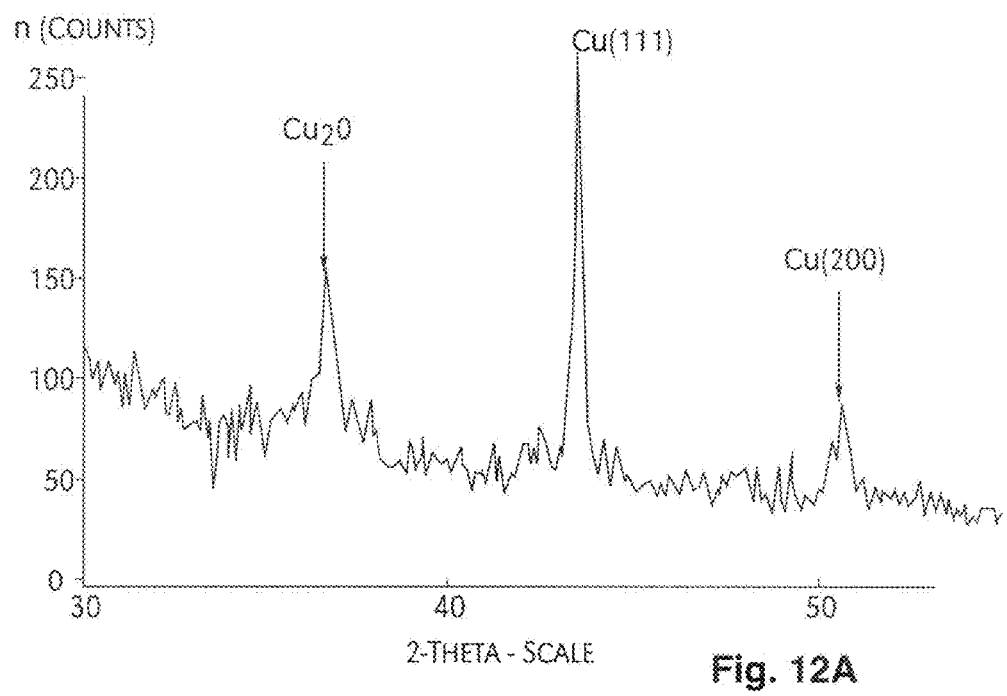
FIG. 12A illustrates American Elements copper nanoparticles pre-cured at 100° C. in air.
Figure 12B:
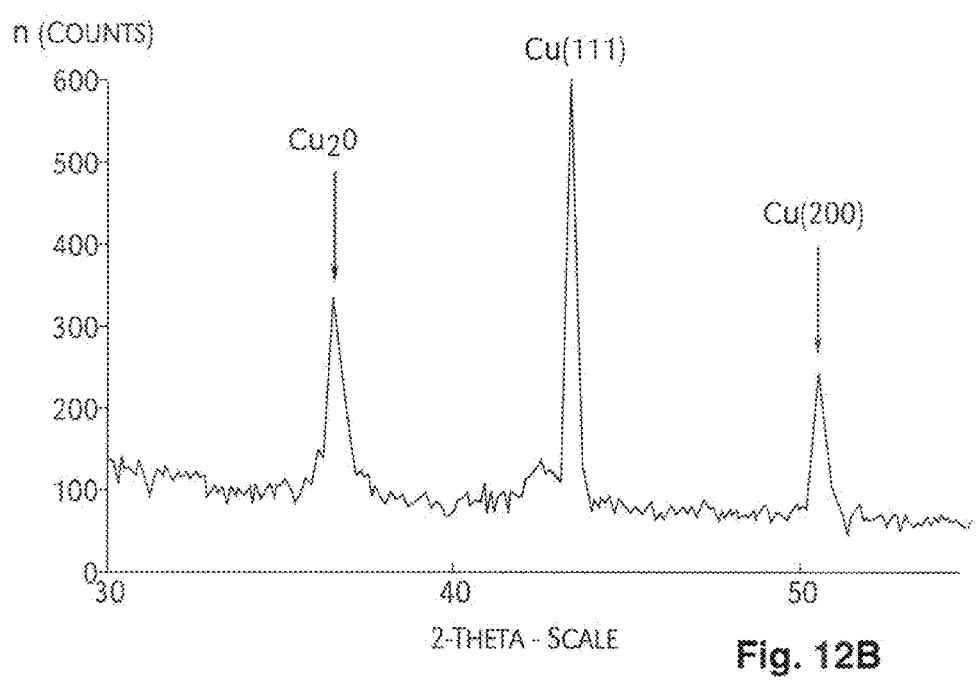
FIG. 12B illustrates American Elements copper nanoparticles are photonic-cured at a voltage of 1300 V and bluish color is observed after photonic curing.
Figure 12C:
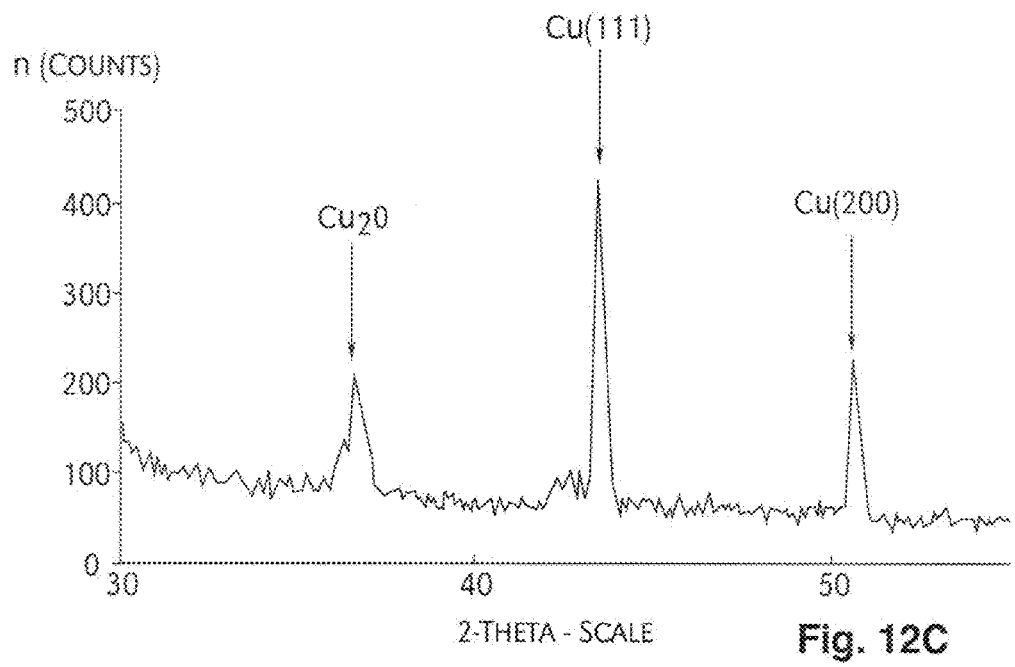
FIG. 12C illustrates American Elements copper nanoparticles are photonic-cured at a voltage of 1400 V and reddish color is observed after photonic curing.

In this case, $Cu_2O$ was completely transformed to copper (200). The same phenomena was observed with American Elements copper nanoparticles, but in this case dependency on the voltage of the photo-curing lamp was observed (see FIG. 12). FIG. 12A illustrates American Elements copper nanoparticles pre-cured at 100° C. in air; FIG. 12B illustrates American Elements copper nanoparticles are photonic-cured at a voltage of 1300 V and bluish color is observed after photonic curing; FIG. 12C illustrates American Elements copper nanoparticles are photonic-cured at a voltage of 1400 V and reddish color is observed after photonic curing.

The visual and XRD data indicate that the reduction of copper oxide to metallic copper is occurring during photonic curing. Following the work of Fleisch (T. H. Fleisch, et al., J. App. Surf. Sci., 10, 50 (1982)), when the band gap of the metal oxide is greater than the enthalpy of formation of the metal oxide, photo-reduction to metal can be achieved by radiating the metal oxides having energy higher than the band gap. The band gaps for $Cu_2O$ and $CuO$ are 1.9 eV (188 kJ/mol) and 2.6 eV (257 kJ/mol), respectively. The corresponding enthalpies of formation of $Cu_2O$ and $CuO$ are 157 kJ/mol and 168 kJ/mol, respectively. Thus, the UV radiation from 100 nm to 400 nm reduces copper oxide to metallic copper.

Figure 13:
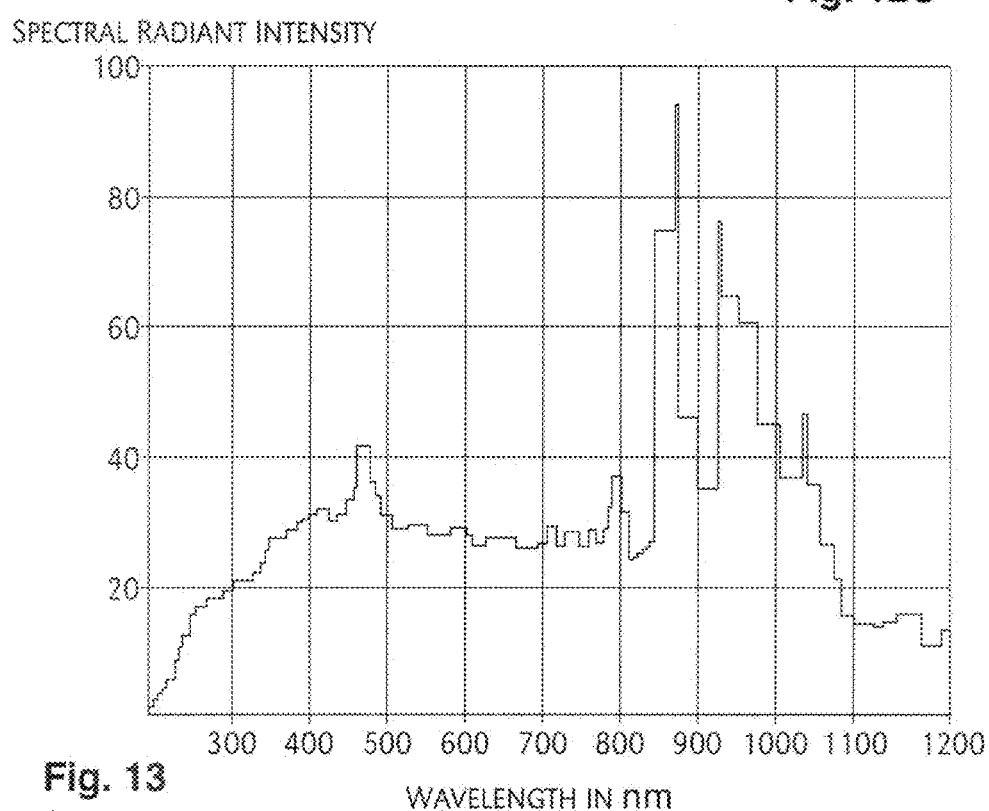
FIG. 13 illustrates a spectrum from a flash xenon lamp.

Nanoparticles Optical Absorption Spectra and the Flash Lamp Spectral Distribution:

Based on the analysis of the optical absorption spectrum, the spectral distribution of the flash lamp is important. The spectral distribution illustrated in FIG. 13 is typical of a xenon lamp whereby approximately 6% of the power used is emitted in the form of UV radiation below 380 nm. Most of the photonic energy actually ranges from visible to infrared wavelengths. It may be useful to have the UV lamp with a higher energy density in UV range as compared with the current flash lamp.

Another possible UV lamp containing decaying excimer complexes may provide improved photonic curing lamps that can fuse and photo-reduce copper oxides at the same time. Excimer lamps offer high intensity narrow band radiation at various UV and VUV wavelengths. Excimer lamps can be extremely efficient energy converters transforming electron kinetic energy into UV radiation. No self-absorption is observed in excimer systems. In most cases, excimer forming gas mixtures exhibit one dominant narrow emission band. Excimer systems can be pumped at extremely high power densities before saturation effects start to limit the spontaneous emission. Thus, extremely bright UV and VUV sources can be built and used with embodiments of the present invention.

This analysis also explains results with the Optomec printer, and may direct even further to a better choice or laser mono-chromatic radiation for achieving the best curing results.

As noted previously, in a process to photosinter metallic inks, they are pre-dried to remove excess vehicles and solvents. This can be carried out in air including with the aid of an oven, but this may require 30-60 minutes of drying time. In a manufacturing process, this time may be too long. The following alternative embodiment describes methods of reducing this drying time.

Figure 26A:
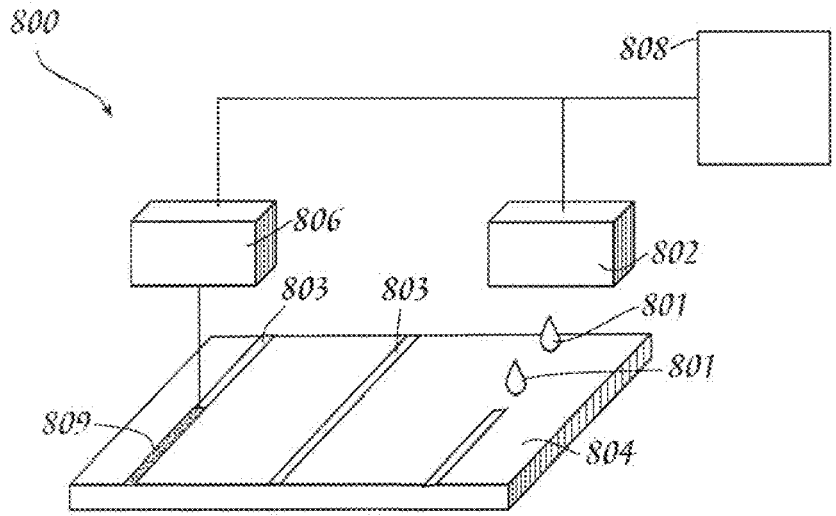
FIGS. 26A and 26B illustrate a system and method for inkjetting and photo-curing of nanoparticle metal films.

Referring to FIG. 26A, a device 800 is shown for simultaneous or near-simultaneous inkjetting and photo-curing of nanoparticle copper films (or any other suitable metal ink). The device includes an inkjet dispenser 802 for dispensing copper ink 801 onto the surface of a substrate 804. The device 800 also includes a light source 806 for curing the ink films 803 deposited by the inkjet dispenser 802. The light source can be a laser source (pulsed or continuous), a pulsed lamp, or a focused beam. In some implementations, the dispenser 802 is arranged to automatically pass over the substrate along a predetermined pathway. Additionally, the dispenser 802 can be arranged to dispense the copper ink at multiple predetermined positions and times above the substrate 804. The light source 806 can be attached to the inkjet dispenser 802 or arranged to travel over the substrate 800 separately from the dispenser 802. The light source 806 can be arranged to photo-cure the inkjetted films immediately after they are deposited by the dispenser 802. Alternatively, the light source 806 can be arranged to photo-cure the films at predetermined times following the deposition of the film. The motion of the light source 806 and the dispenser 802 can be controlled by a computer system/controller arrangement 808. A user may program the computer 808 such that the controller automatically translates the dispenser 802 and light source 806 over a predetermined path. In some implementations, the light source 806 and dispenser 802 are fixed and the substrate is placed on a movable platform controlled by the computer/controller 808.

Figure 26B:
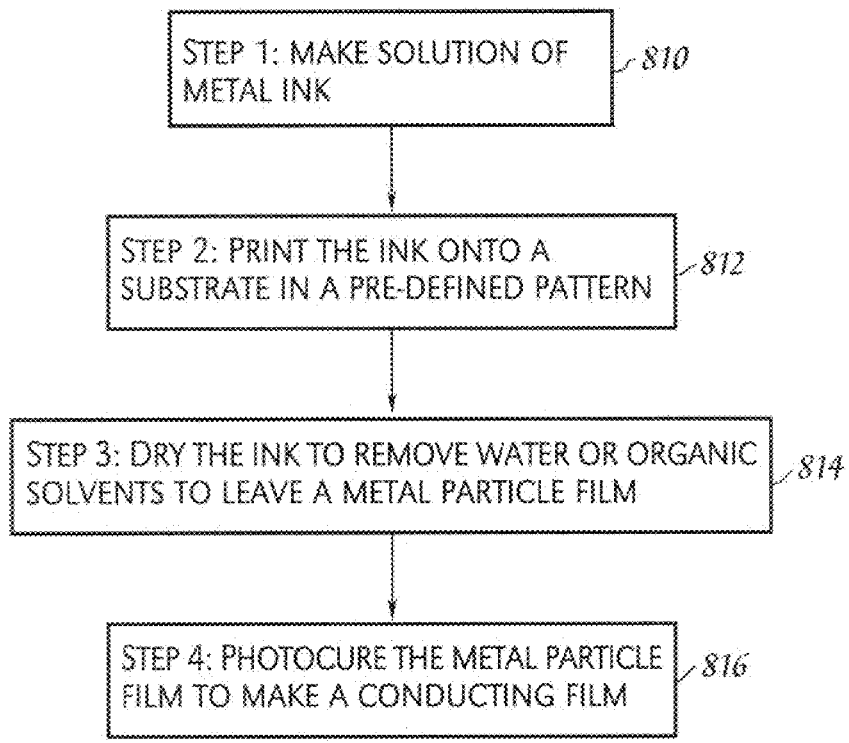

A flow chart of a photo-curing process is shown in FIG. 26B. A solution of metal ink is mixed (810) and then printed or dispensed (812) onto the substrate 804 using the dispenser 802. The film deposition is tightly controlled so a well-defined pattern is formed. The film then is dried (814) to eliminate water or solvents.

In some cases, a thermal curing step can be introduced subsequent to dispensing the film and prior to the photo-curing step. The substrate and deposited film can be cured using an oven or by placing the substrate on the surface of a heater, such as a hot plate. For example, in some implementations, the film is pre-cured in air at 100° C. for 30 minutes before photo-curing. Alternatively, the thermal curing can be performed by directing a laser onto the surface of the film. Following the drying and/or thermal curing step, a laser beam or focused light from the light source 806 is directed (816) onto the surface of the film in a process known as direct writing. The light serves to photo-cure the film such that it has low resistivity. Generally, the metal films are insulating after the printing/dispensing and drying steps. After the photo-curing process, however, the insulating film becomes a conductive film 809 (see FIG. 26A).

In some implementations, the dispenser 802 is used to deposit a blanket film or a coarse outline of the pattern. Typically, printing techniques can achieve feature sizes on the order of 25-50 microns or greater. If finer features are necessary, the pattern/blanket film can be refined or reduced using a focused beam of light or laser, in which case the features are defined by the spot size of the laser or by the focus of the light beam. Typically, light can be focused to 1 micron or less. Thus, submicron features may be possible. Ultimately, the feature size may be limited by the size of the nanoparticles used in the conductive film. Metal particles can be formed to have features on the order of 1-5 nm.

Effect of Vacuum Drying on Copper Nanoparticle Inks:

An experiment was performed to determine the effect of drying the copper nanoparticle inks in a vacuum environment as opposed to an airflow environment. The sample was prepared by sonication and hand agitation. The samples were then printed and dried. Then a vacuum oven was used to dry the inks at various temperatures. For comparison, baseline samples were also prepared in an airflow environment at atmosphere. All samples were photosintered, and the electrical and adhesive properties were measured. A result is that the drying time for the selected ink is significantly reduced if the drying takes place in a vacuum environment.

Processes above describe copper ink samples dried in an airflow environment at atmospheric pressure for 30-60 minutes, depending upon the formulation of the ink. This drying is performed in order to remove by evaporation the solvents that remain in the ink after printing. Evaporation of the solvents aids in the photosintering process that follows. If the ink contains excessive amounts of solvent, the result is what is referred to as "blowoff," a condition where the solvent evaporates rapidly, in fact almost instantly, causing the copper nanoparticles to be blasted off of the substrate and into the surrounding environment.

By removing the solvents more rapidly, the process can be more cost effective for a high-throughput manufacturing system. Experiments were performed at various temperatures but at one vacuum level. It was found that the drying time for a selected ink is reduced when dried at 100° C. or 125° C. without significantly affecting the conductive or adhesive properties when compared to the baseline samples dried in an airflow environment. At 150° C., however, the conductive properties tend to diminish. While the data collected from this experiment proves that drying times are shortened through vacuum drying, this process may also be expanded to include lower temperatures and shorter drying times to further enhance the viability of copper inks in a mass production scenario.

The formulated ink was then sonicated and hand agitated to break up any agglomerations. It was used in a shelf life study for several weeks and then was stored on a shelf until this experiment. Prior to draw-down printing, the ink was hand agitated for approximately 30 seconds, sonicated for 16 minutes, and hand agitated for an additional 30 seconds.

Methods Used:

Draw-Down Printing

Printing was accomplished using a draw-down printer on a Kapton substrate using a #10 wire-wrapped rod. The rod was coated in ink and then drawn across the surface to provide an even coating. Several samples were printed in the same manner to accommodate the scope of the experiment. After printing, the samples were allowed to air dry on a shelf.

Airflow Drying

Two samples were dried in an airflow oven at 100° C., one for 30 minutes and one for 60 minutes. These samples were made to provide a baseline of a standard procedure for later comparison to the vacuum dried samples.

Vacuum Drying

Figures 14, 15:
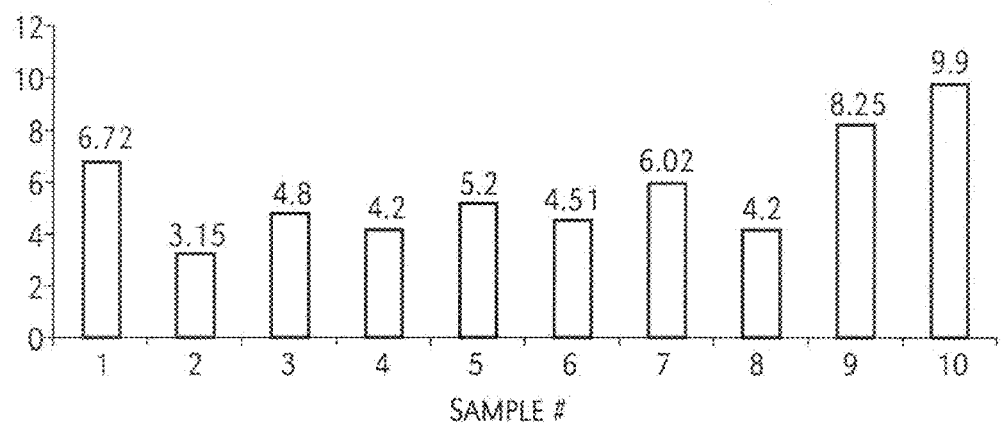
FIG. 14 illustrates drying parameters in accordance with embodiments of the present invention.
FIG. 15 illustrates that the electrical properties for samples 3-8 are very similar to that of sample 2.

The remaining samples were dried in a vacuum oven at various temperatures and for various lengths of time. FIG. 14 shows the drying parameters for each sample. After heating and pumping the empty vacuum oven for outgassing and removing contaminants, the oven was then vented and the following procedure was used for each sample:

Check and record platform temperature by an infrared (IR) thermometer

Place the sample in the center of the platform

Begin vacuum pumping

When pressure reaches approximately −25 inches Hg (93 seconds on average), start the timer When time has expired, record oven pressure (approximately −29.5 inches Hg for all samples)

Immediately vent the oven

When the oven is vented, check and record platform temperature with the IR thermometer Repeat for all samples Presintering Preparation Upon completion of the airflow and vacuum drying, all samples were then scored to provide an adhesion test pattern. The samples were also numbered and measured on a profilometer to provide thickness data before the photosintering step.

Photosintering

Photosintering is the previously described method used to cure the inks to a conductive copper film. This involves exposing the ink to a short pulse of highly concentrated UV light. All samples were photosintered using the same power and pulse widths for each shot. The power used was 1200 V and the pulse widths were 400, 500, 600, 700, and 800 microseconds.

Properties Testing

After photosintering was complete, the adhesive and electrical properties of each sample were characterized. First, sheet resistance of the film was measured using a 4-point probe method. Second, the film thickness was measured on the profilometer. Finally, the adhesion was tested using the ASTM Standard Test Method for Measuring Adhesion by Tape Test. After all data were collected, the resistivity was calculated using the sheet resistance and thickness data.

Results

Figures 16, 17:
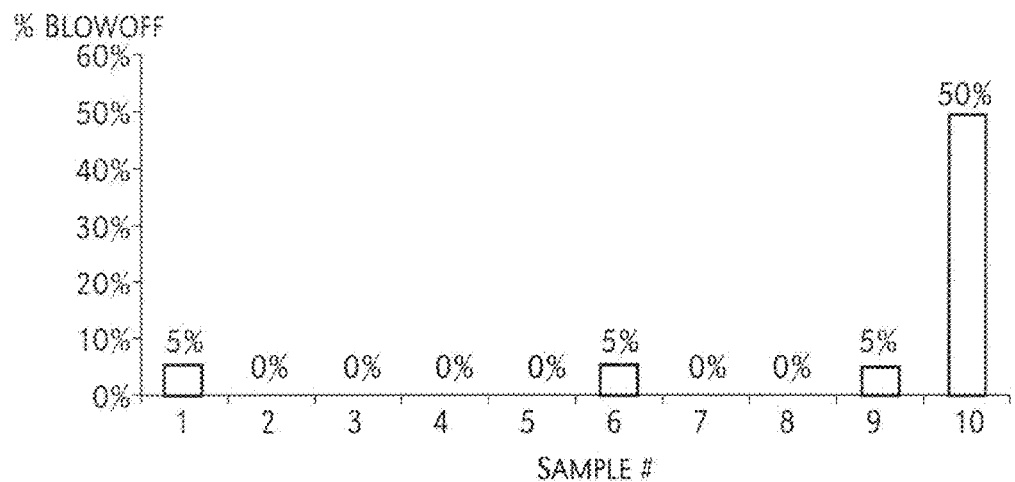
FIG. 16 illustrates the percentage blowoff of the copper from the Kapton during a photosintering step.
FIG. 17 illustrates drying parameters for each sample.

Referring to FIG. 15, the electrical properties for samples 3-8 are very similar to that of sample 2, which was processed using a standard thermal procedure for this formulation. However, samples 9 and 10, which were dried at 150° C. under vacuum significantly increased resistivity. Adhesion was excellent (10 on a scale of 1-10) for all samples in this experiment. These data indicate that vacuum drying is a viable solution to shortening the drying time of copper nanoparticle inks. FIG. 16 shows the percentage blowoff of the copper from the Kapton during the photosintering step. These results show that resistivities in the micro-ohm-cm range with excellent adhesion are achieved in vacuum, and that comparable resistivities are obtained with vacuum drying for 5 minutes at 125° C. (sample #6) as compared to drying at 1 atmosphere pressure for 60 or 30 minutes at 100° C. Sample #6 has only 5% copper blowoff.

Effect of Infrared Drying on Copper Nanoparticle Inks:

An experiment was performed to determine the effect of drying copper nanoparticle inks under an infrared lamp as opposed to an airflow oven environment (standard drying process). The sample was prepared by sonication and hand agitation. The samples were then printed and air dried. An infrared lamp was then used at various distances to further dry the inks. For comparison, one sample was cured with no drying process and another sample was dried in an airflow oven environment. All samples were photosintered, and electrical and adhesive properties were measured. The data collected in this experiment indicates that drying by infrared lamp reduces the drying time required when compared to airflow oven drying. Interestingly, the sample that was not subjected to any drying process showed similar electrical properties to the sample that was dried in an airflow oven.

The experiment was performed using a commercially available infrared lamp to dry the samples at various distances to the lamp in open air. It was found that drying the sample at a short distance for any reasonable length of time as well as a medium distance for an extended length of time caused significant damage to the ink and in turn caused the ink to blow off during photosintering. Samples dried at medium to long distances for any length of time showed little change and, in some cases, slight improvement when compared with the sample dried in an airflow oven.

While the data collected from this experiment is sufficient in showing that drying times are shortened through infrared drying, this experiment can also be expanded to include a greater variety of parameters (distance and time) to further enhance the viability of copper inks in a mass production setting.

Materials Used in this Experiment:
Infrared Lamp=Phillips 250W red heat lamp mounted in a clamp-on style reflector socket
Airflow Oven=Despatch (model #LCCL-54)
Draw-Down=Gardco Auto-Draw III (model #DP-1250)

Solid copper nanoparticles were added to the dispersion medium in an $N_2$ purged glove box, and the chunks were broken up in the media with a small spatula. The ink was then sonicated and hand agitated to break up any agglomerations. It was used in a shelf-life study for several weeks and then was stored on a shelf. Just prior to draw-down printing, the ink was hand agitated for approximately 30 seconds, sonicated for 8 minutes, and hand agitated for an additional 30 seconds.

Methods Used:

Draw-Down Printing

Printing was accomplished using a draw-down printer on a Kapton substrate using a #10 wire-wrapped rod. The rod was coated in ink and then drawn across the surface to provide an even coating. Several samples were printed in the same manner to accommodate the scope of the experiment. After printing, the samples were allowed to air dry on a shelf. One sample was left in this state before curing.

Airflow Baking

One sample was dried in an airflow oven at 100° C. for 30 minutes. This sample was made to provide a baseline of a standard recipe for later comparison to the infrared dried samples.

Infrared Drying

The remaining samples were dried under an infrared lamp at various distances to the lamp and for various lengths of time. FIG. 17 shows the drying parameters for each sample. The samples were dried on an insulating ceramic platform to minimize heat transfer from the sample to the platform and vice-versa.

Pre-Sintering Preparation

Upon completion of sample drying, all samples were scored to provide a means of measuring film thickness. The samples were then measured on a profilometer to provide thickness data before the photosintering step.

Photosintering

All samples were photosintered using the same power and pulse widths for each shot. The power used was 1200 V and the pulse widths were 500, 600, and 700 µsec. This an abbreviated version of the standard recipe used at the time of the experiment.

Properties Testing

After photosintering was complete, the adhesive and electrical properties of each sample were characterized. First, sheet resistance of the film was measured using a 4-point probe method. Second, the film thickness was measured on the profilometer. Finally, the adhesion was tested by applying and subsequently removing a strip of adhesive tape. After all data was collected, the resistivity was calculated using the sheet resistance and thickness results.

Results

Referring to FIG. 18, the electrical properties for samples 5 and 7-10 are better than that of sample 2, which was processed using the standard bake for this formulation. However, samples 3 and 4, which were dried at close range, infinite resistivity due to the film being completely blown off during the curing process. Sample 6, which was dried at 6 inches for 30 minutes, also possessed increased resistivity. Adhesion was acceptable for most samples in this experiment. Blowoff was an issue on virtually all samples ranging anywhere from 10% to 100% depending upon the drying parameters. Sample 1 was only dried in air with no applied heat. This sample, while exhibiting slightly more blowoff, had a comparable resistivity to the oven dried sample. Overall, this data indicates that while infrared drying reduces the drying time required as well as the resistivity, blowoff may be an issue. FIG. 19 shows the percentage blowoff of the copper from the Kapton during the photosintering step.

Conclusions

Sample #14 had a low resistivity of 6.24 microohm-cm with a small blow off (30%) of the copper conductor (see FIGS. 18 and 19).

Effect of Microwave Drying:

Solvent Based Inks

An experiment was performed to determine the effect of microwave drying of copper nanoparticle inks as opposed to airflow oven drying. The sample was prepared by sonication and hand agitation. The samples were then printed and dried. Then a microwave oven was used to dry the inks for various periods of time. For comparison, a baseline sample was also prepared in an airflow oven environment. Finally, all samples were photosintered and electrical and adhesive properties were measured. The data collected in this experiment indicates that microwave drying of copper nanoparticle inks provides no significant increase in ink performance.

The experiment was performed for various periods of time, but at only one power level (100%). It was found that the drying time for the selected ink may not be reduced by microwave drying when compared to the baseline samples baked in an airflow oven. While the data collected from this experiment is believed to be sufficient in proving that drying times may be unaffected by microwave drying, this experiment may also be expanded to include different power levels and longer drying times to further enhance the data.

Materials Used:

Microwave Oven=General Electric Household Microwave Oven (model #JES737WM01)

Airflow Oven=Despatch (model #LCCL-54)

Draw-Down=Gardco Auto-Draw III (model #DP-1250)

Ink Formulated:

Solid copper nanoparticles were added to the dispersion medium in an $N_2$ purged glove box and chunks were broken up in the media with a small spatula. The ink was then sonicated and hand agitated to break up any agglomerations. It was used in a shelf life study for several weeks and then was stored on a shelf until this experiment. Prior to draw-down printing, the ink was hand agitated for approximately 30 seconds, sonicated for 8 minutes and hand agitated for an additional 30 seconds.

Methods Used:

Draw-Down Printing

Printing was accomplished using a draw-down printer on a Kapton substrate using a #10 wire-wrapped rod. The rod was coated in ink and then drawn across the surface to provide an even coating. Several samples were printed in the same manner to accommodate the scope of the experiment. After printing, the samples were allowed to air dry on a shelf.

Airflow Baking

One sample was baked in an airflow oven at 100° C. for 60 minutes. These samples were made to provide a baseline of the standard recipe for later comparison to the vacuum baked samples.

Vacuum Baking

The remaining samples were dried in a microwave oven for various periods of time. FIG. 20 shows the drying parameters for each sample. Each sample was placed in the center of the microwave on the rotating glass plate.

Pre-Sintering Preparation

Upon completion of the airflow and microwave drying, all samples were scored and measured on a profilometer to provide thickness data before the photosintering step.

Properties Testing

After photosintering was complete, the adhesive and electrical properties of each sample were characterized. First, sheet resistance of the film was measured using a 4-point probe method. Second, the film thickness was measured on the profilometer. Finally, the adhesion was tested by applying and subsequently removing a strip of adhesive tape. After all data was collected, the resistivity was calculated using the sheet resistance and thickness data.

Results

Figure 21:
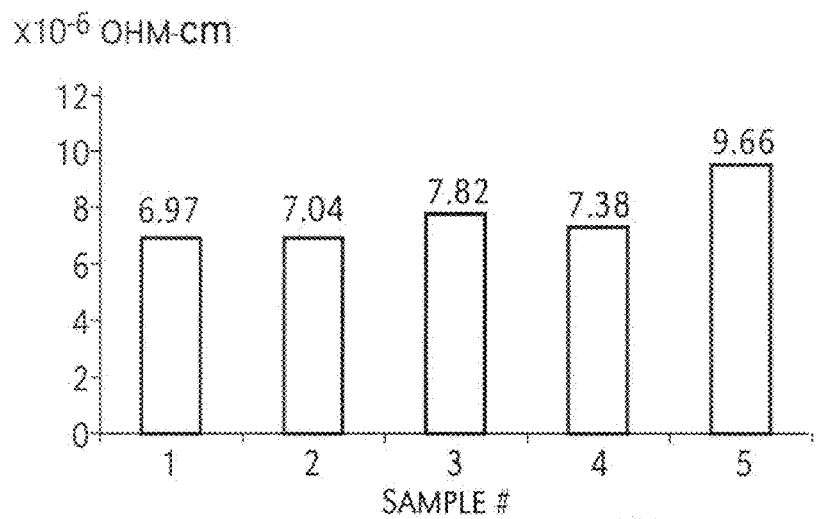
FIG. 21 illustrates that samples 2-5 had increased resistivity when compared to that of sample 1.

Referring to FIG. 21, shows that samples 2-5 had increased resistivity when compared to that of sample 1, which was processed using the standard bake for this formulation. Blowoff may be an issue with all samples ranging anywhere from 10% to 80% (see FIG. 22). Adhesion was marginal at best (3 to 8 on a 10 point scale) for all samples. This data indicates that microwave drying may not be a viable solution to shortening the drying time of copper nanoparticle inks.

Conclusions

Figure 22:
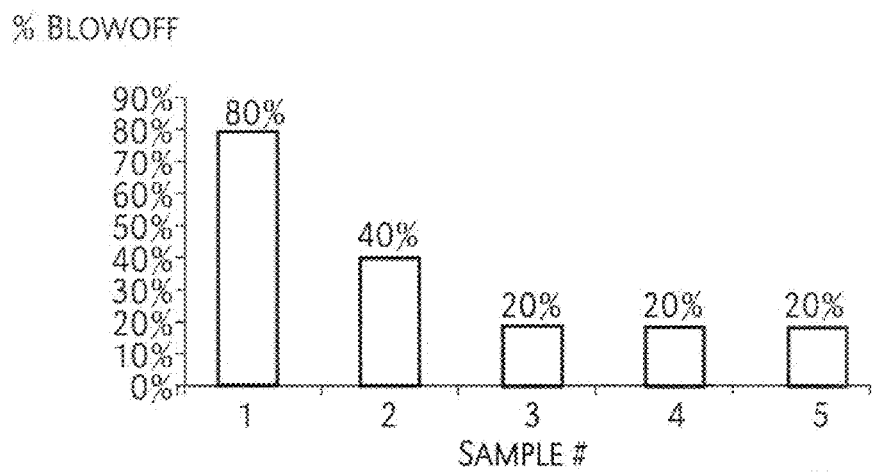
FIG. 22 illustrates that samples 3 and 4 had low resistivity while having only 20% blowoff during photosintering.

Samples 3 and 4 low resistivity while having only 20% blowoff during photosintering (see FIG. 22).

Water Based Inks

Figure 23:
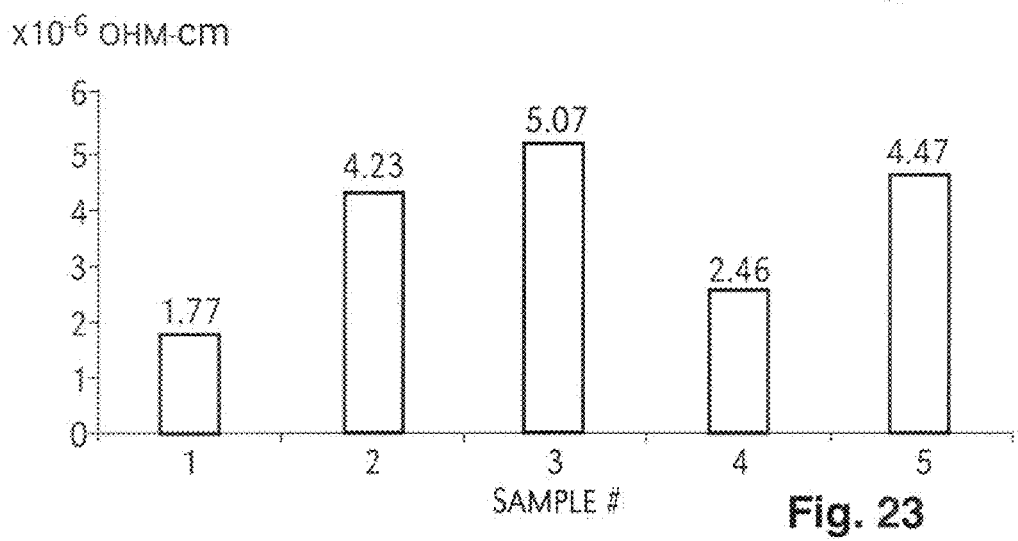
FIG. 23 illustrates electrical properties for the samples.

The ink was a water-based copper ink. The data in FIG. 23 shows the electrical properties for the samples in FIG. 24. The post-sintering thickness for sample 1 is in question, hence the unrealistically low resistivity.

Figures 24, 25:
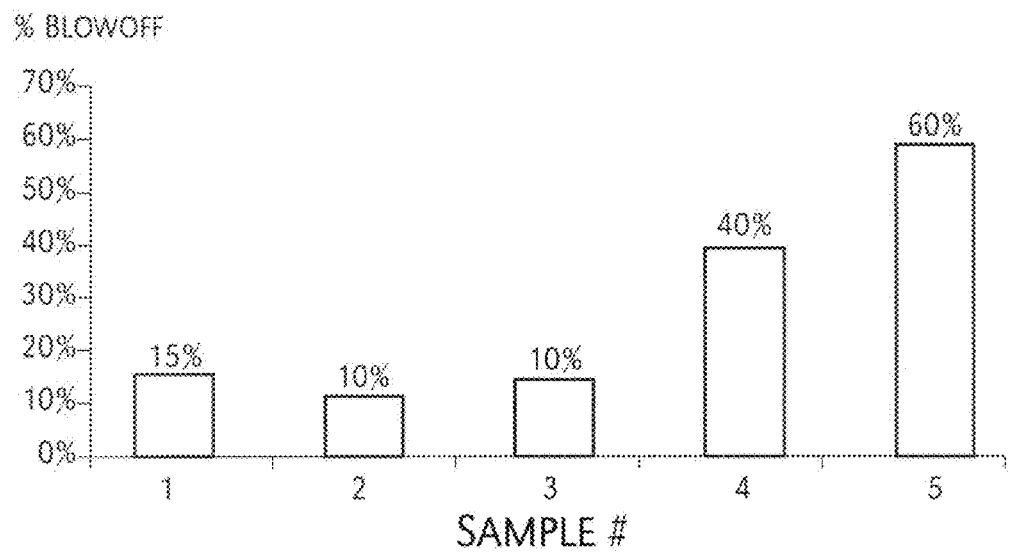
FIG. 24 illustrates drying times.
FIG. 25 illustrates percentage blowoff of copper from Kapton during a photosintering process.

FIG. 25 shows the percentage blowoff of the copper from the Kapton during the photosintering step.

Conclusions

These results show that drying the coated samples from the water based inks using 30 seconds of microwave radiation may provide a low resistivity (see FIG. 23) while keeping the blowoff to only 10% (sample 2) (see FIG. 25).

These results show that resistivities in the micro-ohm-cm range with excellent adhesion are achieved in vacuum, and that comparable resistivities are obtained with vacuum drying for 5 minutes at 125° C. as compared to drying at 1 atmosphere pressure for 60 or 30 minutes at 100° C.

A number of embodiments of the invention have been described. Nevertheless, it will be understood that various modifications may be made without departing from the spirit and scope of the invention. For example, other conductive metals may be used instead of, or in addition to, copper.

Summary

In summary, optical absorption of copper inks is a complicated system of many particles, which is determined by both properties of the individual structural units and the collective effects due to the interaction among particles. This spectrum often contains both the plasmon band of the single particles and sometimes more maxima attributed to excitation with the electric field parallel (low energy mode) and normal (high energy mode) to the axes of a chain of agglomerated particles. In this case, approximation of the metallic particle to a spherical shape is not accurate anymore, and one needs to look at a prolate spheroidal as the calculations were made in FIG. 5. Indeed, observed from FIG. 5 is that as the agglomerates become more ellipsoid-like, the spectrum is changing from Spectra (b) to Spectra (a), as discussed above.

Determined:

(A) The color and the size distribution of the metallic copper nanoparticles in a dry form or in a solution;

(B) The mean free path of electrons in bulk copper is 39 nanometers explains the empirical choice of particles around 50 nanometers whereby the size of the particles, if well-dispersed, is of the same magnitude as the electron mean free path;

(C) The heat capacity behavior of nanoparticles as a function of size and why during the photo-curing process fusion and excellent electrical conductivity results are obtained;

(D) The optical behavior of copper metallic nanoparticles and correlation of the color of the ink with good dispersion qualities and eventually better fusion in the photo-curing process;

(E) The transformation of the copper oxide to copper during the curing process with direct relations to the ink quality and the resistivity after the photonic curing process;

(F) An optimal lamp for photo-curing. Having a lot of energy in the visible and in the infrared ranges may not be useful. A good dispersion of isolated copper nanoparticles may require energies with a wavelength lower than 400 nanometers. This may simplify the availability of suitable lamps and lower their energy consumption.

(G) Certain photo-curing processes require higher energy for achieving a complete transformation of copper oxide to copper, which provides parameters for an optimal design of the lamps by exploiting the most useful spectrum of the lamp in correlation with the specific copper metallic nanoparticle's manufacturer and the copper nanoparticle size distribution in the ink.

(H) Since the rapid evaporation of volatile components from the ink leads to removal of the metal conductor from the substrate, it is advantageous that they are evaporated prior to the photo-curing step.

(I) Conventional evaporation involves heating in air for 30 or 60 minutes, which can be shortened by using vacuum or microwave drying methods.

We claim:

1. A method comprising:
   depositing a pattern of metallic ink comprising copper nanoparticles that contain copper oxides;
   photosintering the metallic ink, wherein the photosintering comprises radiating the copper nanoparticles containing the copper oxides with a photonic energy greater than band gap energies of the copper oxides to thereby photo-reduce the copper oxides contained in the copper nanoparticles to metallic copper; and
   drying the metallic ink between the depositing and photosintering steps, wherein the drying and photosintering is performed in ambient air.

2. The method of claim 1, wherein an average size of the copper nanoparticles in the metallic ink is in a range of 50 nanometers to 120 nanometers, inclusive thereof.

3. The method of claim 1, wherein an average size of the copper nanoparticles in the metallic ink is in a range of 50 nanometers to 70 nanometers, inclusive thereof.

4. The method of claim 1, wherein a visible color of the metallic ink is brown or red-brown.

5. The method of claim 1, wherein the photosintering is performed with a UV lamp with a wavelength of about 100-400 nm.

6. The method of claim 5, wherein the UV lamp contains a decaying excimer complexes.

7. The method of claim 1, wherein plasmon oscillations of the nanoparticles contributes to their absorption of energy during the photosintering.

8. The method of claim 1, wherein the photosintering photo-cures the metallic ink.

9. The method of claim 1, wherein the photosintering lowers the electrical resistivity of the deposited metallic ink.

10. The method of claim 1, wherein the photosintering further comprises fusing together the copper nanoparticles simultaneously with the photo-reduction of the copper oxides contained in the copper nanoparticles.

11. The method of claim 10, wherein the metallic copper photo-reduced from the copper oxides contained in the copper nanoparticles melts on surfaces of the copper nanoparticles to thereby begin the fusing together of the copper nanoparticles within the deposited metallic ink.

12. The method of claim 1, wherein the photo-reduction of the copper oxides contained in the copper nanoparticles adds electrons to surfaces of the copper nanoparticles thereby increasing an absorption of the photonic energy by the copper nanoparticles.

13. The method of claim 1, wherein the metallic ink comprises IPA, hexylamine, and the copper nanoparticles containing the copper oxides.

14. The method of claim 1, wherein the copper oxides contained in the copper nanoparticles comprise $Cu_2O$.

15. The method of claim 14, wherein an x-ray diffraction net counts ratio of metallic copper to $Cu_2O$ is 13:1 after the photosintering of the deposited metallic ink.

16. The method of claim 15, wherein the x-ray diffraction net counts ratio of metallic copper to $Cu_2O$ was 2.1:1 before the photosintering of the deposited metallic ink.

17. The method of claim 1, wherein the band gap energies of the copper oxides contained in the copper nanoparticles are greater than enthalpies of formation of the copper oxides.

18. The method of claim 1, wherein a voltage of the photosintering is 1200 volts.

19. The method of claim 1, wherein a resistivity of the photosintered metallic ink is in a range of $3.15 \times 10^{-6}$ ohm-cm to $8.25 \times 10^{-6}$ ohm-cm with a blow off of less than or equal to 5% of the photosintered metallic ink from a substrate on which the metallic ink is deposited.

20. The method of claim 4, wherein a resistivity of the photosintered metallic ink is in a range of $5 \times 10^{-6}$ ohm-cm to $92 \times 10^{-6}$ ohm-cm.

21. A method comprising:
   depositing a pattern of metallic ink comprising copper nanoparticles that contain copper oxides;
   photosintering the metallic ink, wherein the photosintering comprises radiating the copper nanoparticles containing the copper oxides with a photonic energy greater than band gap energies of the copper oxides to thereby photo-reduce the copper oxides contained in the copper nanoparticles to metallic copper; and
   drying the metallic ink between the depositing and photosintering steps wherein the photosintering is performed in ambient air.

22. A method comprising:
   depositing a pattern of metallic ink comprising copper nanoparticles that contain copper oxides;
   photosintering the metallic ink, wherein the photosintering comprises radiating the copper nanoparticles containing the copper oxides with a photonic energy greater than band gap energies of the copper oxides to thereby photo-reduce the copper oxides contained in the copper nanoparticles to metallic copper, wherein the photo-reducing of the copper oxides to metallic copper is performed in ambient air.

* * * * *